(12) United States Patent
Gershon et al.

(10) Patent No.: US 7,072,781 B1
(45) Date of Patent: Jul. 4, 2006

(54) ARCHITECTURE FOR GENERATING ADAPTIVE ARBITRARY WAVEFORMS

(75) Inventors: Eugen Gershon, San Jose, CA (US);
David Gaun, Brookline, MA (US);
Colin S. Bill, Cupertino, CA (US);
Tzu-Ning Fang, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 25 days.

(21) Appl. No.: 10/885,284

(22) Filed: Jul. 6, 2004

(51) Int. Cl.
*G01R 31/36* (2006.01)

(52) U.S. Cl. ............... 702/63; 702/58; 702/66; 702/117; 324/426; 324/436; 324/603

(58) Field of Classification Search ............ 702/58, 702/63, 66, 117; 324/426, 436, 603
See application file for complete search history.

(56) References Cited

U.S. PATENT DOCUMENTS 5,001,714 A * 3/1991 Stark et al. ............... 714/737
6,411,098 B1 * 6/2002 Laletin ...................... 324/436
6,415,244 B1 * 7/2002 Dickens et al. ............ 702/187
2003/0206021 A1 * 11/2003 Laletin et al. .............. 324/426

* cited by examiner

*Primary Examiner*—Marc S. Hoff
*Assistant Examiner*—Janet Robbins
(74) *Attorney, Agent, or Firm*—Amin & Turocy, LLP

(57) ABSTRACT

A test system having a feedback loop that facilitates adjusting an output test waveform to a DUT/CUT (Device Under Test/Circuit Under Test) on-the-fly according to changing DUT/CUT parameters. The system includes a tester having an arbitrary waveform generator (AWG) and a data acquisition system (DAS) that monitors the status of the DUT/CUT. The AWG and DAS connect to the DUT/CUT through a feedback loop where the AWG outputs the test waveform to the DUT/CUT, the DAS monitors the DUT/CUT parameters, and the DAS analyzes and communicates changes to the AWG to effect changes in the output waveform, when desired. The AWG builds the output waveform in small slices (or segments) that are assembled together through a process of selection and calibration. The feedback architecture facilitates a number of changes in the output waveform, including a change in the original order of the preassembled slices, and changes in the magnitude/shape of the output waveform.

30 Claims, 21 Drawing Sheets

ARCHITECTURE FOR GENERATING ADAPTIVE ARBITRARY WAVEFORMS

TECHNICAL FIELD

This invention is related to device and/or circuit testing systems.

BACKGROUND OF THE INVENTION

In the competitive world of electronics, companies are continually taken to task to ensure that the products they sell are of the utmost reliability and quality. A company must test its products to determine the quality of the product at any point in the design and manufacture process.

In the field of microelectronics, for example, such testing requires more advanced techniques to ensure the viability of high-speed microelectronics circuits and devices. More recent semiconductor designs involve circuits and devices that can only truly be quality tested using mixed signals that are both analog and digital in nature. Test equipment manufacturers have responded to this application with the arbitrary waveform generator (AWG). The AWG provides manufacturers with the flexibility to define and generate test waveforms with almost infinitely variable signal characteristics, and have become an indispensable design and test tool in the engineer's kit.

The AWG offers a degree of versatility that few other instruments can match. In addition to creating standard waveforms, they can generate "real world" signals with all the glitches, drift, noise and other anomalies that a device-under-test (DUT) or circuit-under-test (CUT) will encounter when it leaves the lab or manufacturing floor. With the capability to produce a wide variety of waveforms, mixed signal sources embrace applications to microelectronic testing.

In some cases the existing performance flexibility of the AWG is not sufficient. For example, it is not likely that the engineer can find a specification that explicitly defines the capability to generate a waveform suitable for a specific semiconductor circuit or device, given that such circuits and devices are evolving at a rapid pace in laboratories. In general, an AWG's ability to generate a specific signal must be demonstrated by example.

What is needed is an improved testing system that at least includes the capability to modify a waveform applied to a DUT/CUT during the testing process.

SUMMARY OF THE INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The present invention disclosed and claimed herein, in one aspect thereof, comprises a test system that is a tool for investigating device behavior or circuit behavior. The tool can be used for a variety of cases-especially when unknowns in circuit behavior require an adaptive test procedure. A combination of an arbitrary waveform generator (AWG) and a data acquisition system (DAS) allows changes in a waveform in response to the behavior of the circuit under test in real time. The test system includes an arbitrary waveform generator (AWG) and a data acquisition system (DAS) connected through a feedback loop that enables the AWG to change its output waveform on the fly based on the parameters of a device under test (DUT) or circuit under test (CUT) that is being monitored by the DAS. The system includes a tester having the AWG and the DAS that monitors the status of the DUT/CUT. The AWG and DAS connect to the DUT/CUT through a feedback loop where the AWG outputs the test waveform to the DUT/CUT, the DAS monitors the DUT/CUT parameters, and the DAS analyzes and communicates changes to the AWG to effect changes in the output waveform, when desired. The AWG builds the output waveform in small slices (or segments) that are assembled together through a process of selection and calibration. The feedback architecture facilitates a number of changes in the output waveform, including a change in the original order of the preassembled slices, and changes in the magnitude/shape of the output waveform.

In another aspect of the present invention, the test system is configured for testing a polymer memory cell.

In still another aspect of the present invention, the test system comprises a tester the interfaces to an external computer for control, configuration and presentation of data and signals.

In yet another aspect thereof, the test system is a self-contained system where capabilities of the external computers are combined into the tester.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention may become apparent from the following detailed description of the invention when considered in conjunction with the drawings.

DETAILED DESCRIPTION OF THE INVENTION

Figure 1:
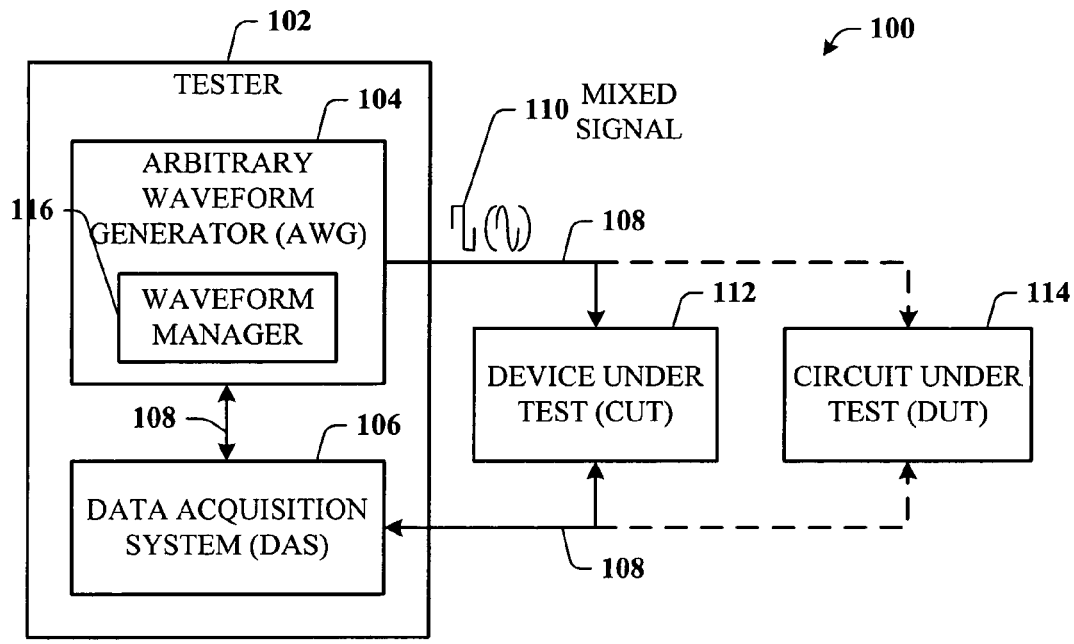
FIG. 1 illustrates a test system in accordance with the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

As used in this application, the terms "component" and "system" are intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers.

Referring now to FIG. 1, there is illustrated a test system 100 in accordance with the present invention. The test system 100 comprises a tester 102 that includes an arbitrary waveform generator (AWG) 104 and a data acquisition system (DAS) 106 connected through a feedback loop 108 that enables the AWG 104 to change its output waveform 110 on-the-fly based on the status of a device under test (DUT) 112 or circuit under test (CUT) 114 that is being monitored by the DAS 106. The AWG 104 includes a waveform generator 116 that outputs the waveform 110 in accordance with initial configuration parameters, which initial parameters can then be adjusted dynamically as the test on the DUT/CUT proceeds. The generator 116 builds the output waveform 110 in small slices (or segments) that are assembled together through a process of selection and calibration. As the waveform 110 is imposed on the DUT/CUT, the DAS 106 monitors one or more parameters of the DUT/CUT. For example, the DUT/CUT could manifest a certain current or voltage (or other parameter or combination of parameters) that requires a change in the waveform 110. The feedback architecture facilitates a number of changes in the output waveform 110, including a change in the original order of the preassembled slices, and changes in the magnitude/shape of the output waveform 110. The system tester 102 is built as a combination of fast analog and digital circuits, programmable logic for user interface and settings, and waveform memory (on both the AWG 104 and DAS 106). Fast ADC (analog-to-digital converter) devices and DAC (digital-to-analog converter) devices allow speeds up to one giga-samples per second (Gsps) using existing off-the-shelf components.

The test system 100 can be applied to any equipment, device, or circuit that is chosen to be tested, even to consumer-level devices. Particularly, the system can be used to characterize polymer cell electrical behavior and be the basic tool for model generation. The tester is designed to drive the cell into "programmed" and "erased" states while monitoring the current through the cell and voltage across it. Since many aspects of cell behavior are still unknown/unexplained, the tester also records the data for further processing.

Figure 2:
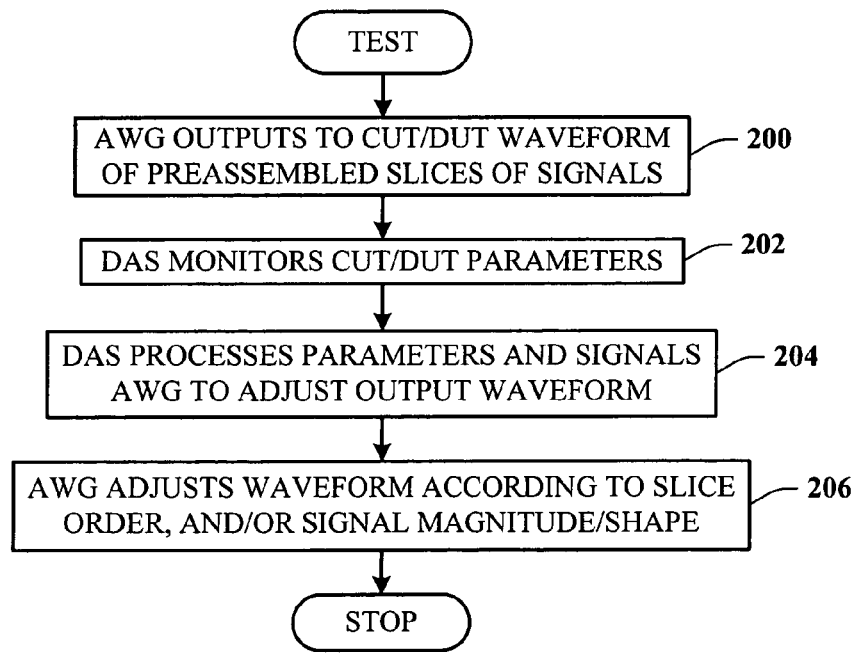
FIG. 2 illustrates a flow chart according to the test system of the present invention.

Referring now to FIG. 2, there is illustrated a flow chart according to the test system of the present invention. While, for purposes of simplicity of explanation, the one or more methodologies shown herein, e.g., in the form of a flow chart, are shown and described as a series of acts, it is to be understood and appreciated that the present invention is not limited by the order of acts, as some acts may, in accordance with the present invention, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the present invention.

At 200, the AWG outputs a waveform to the DUT/CUT. At 202, the DAS monitors parameters of the DUT/CUT during the testing phase. At 204, the DAS processes and analyzes the parameters, and signals the AWG to adjust the output waveform. At 206 the AWG adjusts the output waveform according to the order of signal slices and/or signal magnitude/shape. The process then reaches a Stop block.

Figure 3:
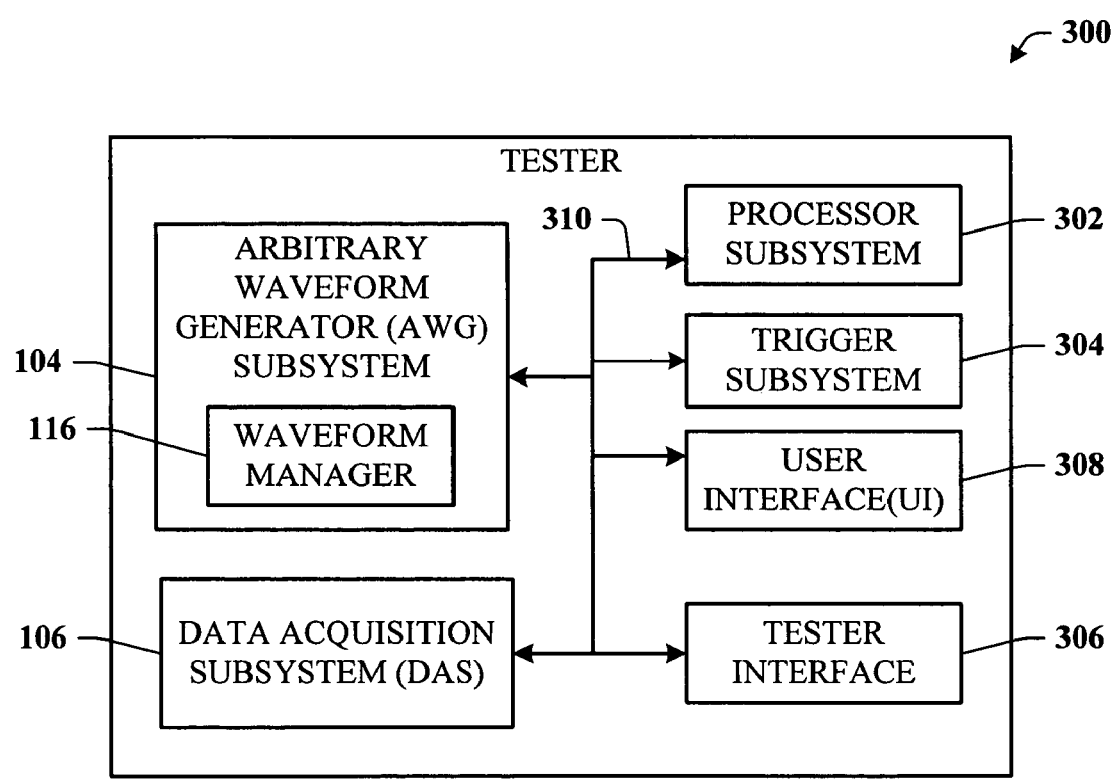
FIG. 3 illustrates a more detailed block diagram of a tester.

Referring now to FIG. 3, there is illustrated a more detailed block diagram of a tester 300. The tester 300 includes the AWG subsystem 104 to control output of the waveform, the waveform manager subsystem 116 that processes the waveform according to changed DUT/CUT parameters, the DAS subsystem 106 that connects to the DUT/CUT to receive parameter signals during the test operation, a processor subsystem 302 that facilitates control and interaction of tester subsystems, a trigger system 304 that facilitates event triggering, and a tester interface 306 that provides the hardware communication and data connections to the DUT/CUT. The tester 300 can also include a user interface (UI) subsystem 308 that facilitates visual and user interaction therewith. The UI 308 can be an LCD monitor, a plasma monitor, or any suitable display, for example. Each of the subsystems (104, 106, 302, 304, 306, and 308) is interconnected by an internal communication bus 310, according to conventional communication schemes. Note that the UI 308 can be an external monitor that interfaces to the tester 300 via the tester interface 306 for providing a means of perceiving data and control information of the tester subsystems. The tester interface 306 can also accommodate user input devices, such as a wired/wireless keyboard, mouse, trackball, etc., to allow the user to interact therewith.

Figure 4:
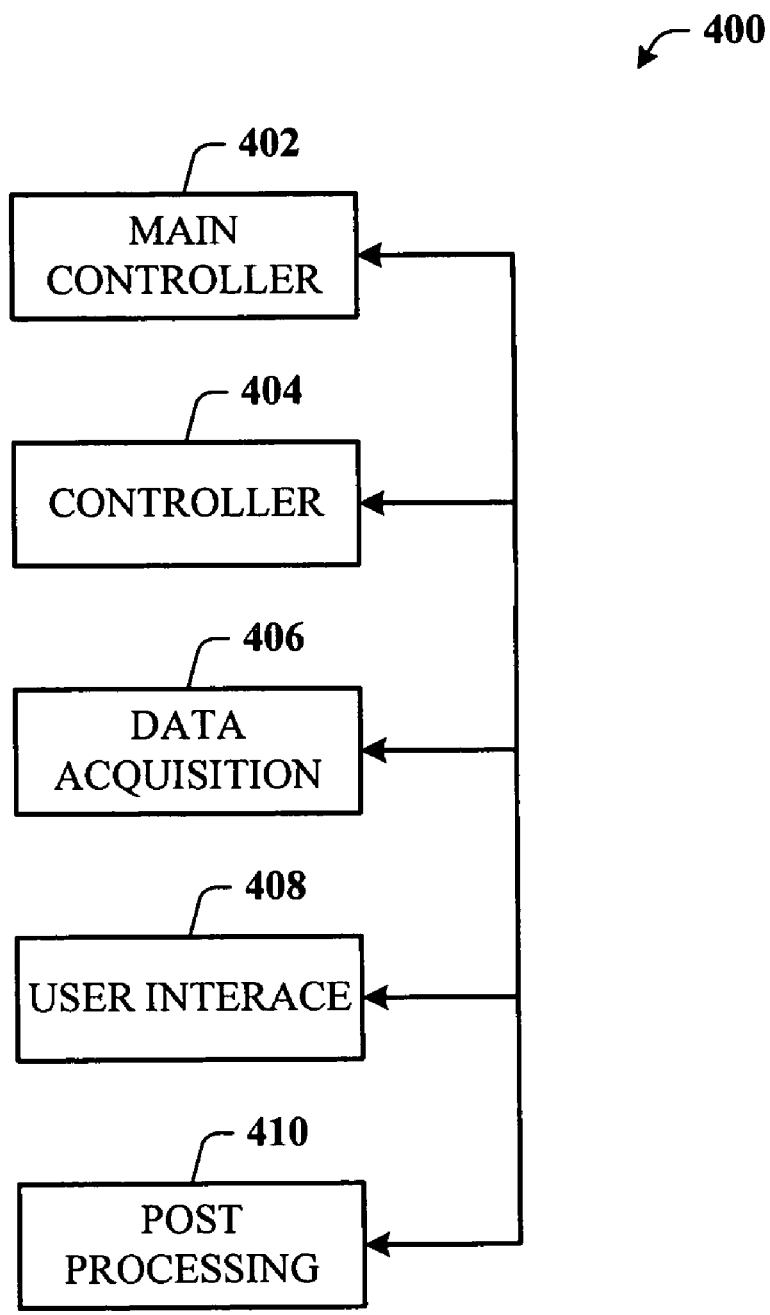
FIG. 4 illustrates a diagram of the general software components of the tester system of the present invention.

Referring now to FIG. 4, there is illustrated a diagram of the general software components 400 of the tester system of the present invention. A main controller software module 402 executes with the waveform manager 116 (of FIG. 3) to facilitate control of at least the inputs and outputs of the DAS, the UI, and AWG. Where an external computer (not shown) is used to interface to the tester, the main controller software 402 also interfaces thereto for the communication management of signals and data. There is provided a controller software module 404 the functions of which can be combined with the main controller module 402. However, it can be advantageous to separate the functions for efficiency and bandwidth purposes. For example, the main controller module 402 can be tasked with managing interaction between the other modules, while the controller 404 can be dedicated for more specific tasks related to waveform slicing, generation, and control. The controller 404 can manage tester-computer communications, UI parameters, initialization, activation, statusing, and data handling, for example. In one implementation, the controller module 404 is hosted in an external computer that communicates with the tester.

The software components 400 also include a data acquisition software module 406 that manages data acquisition and data communication of the DAS. Where the tester interfaces to an external computer, the data acquisition module can also communicate the data to the computer for processing and presentation. A UI software module 408 facilitates inputting, presenting, and viewing of the tester information, such as data and signals, for example. The user can input system parameters, test parameters, control the application operating mode, repetition rate, waveform parameters, cause the output of parameters, initiate waveform generation instructions to tester circuitry, manage the DAS data format and, perform verification and acknowledgements, to name just a few. A post-processing software module 410 performs processing of the data and signals received by the DAS during testing of the DUT/CUT, such as the application of mathematical algorithms on the data. It is to be appreciated, however, that the post processing module 410 can also be used to process initial configuration data (e.g., calibration) before the test begins, or any data acquired from initial setup to final results of the test process after the testing has completed.

Polymer Cell Testing

As indicated hereinabove, the system can be used to characterize polymer cell electrical behavior and is a basic tool for model generation. The tester is designed to drive the cell into "programmed" and "erased" states while monitoring the current through the cell and voltage across it. Since many aspects of cell behavior are still unknown/unexplained, the tester also records the data for further processing.

Figure 5:
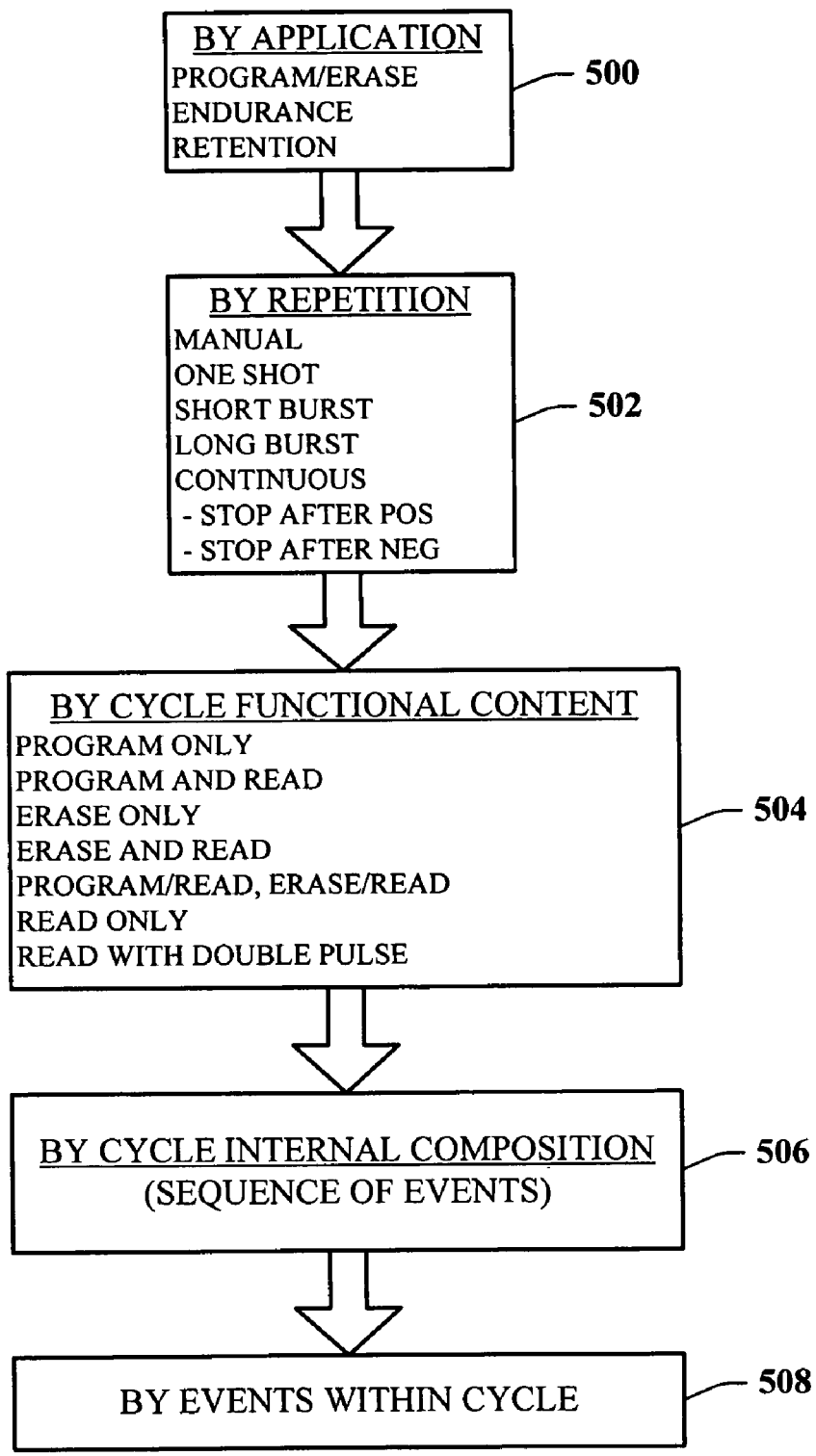
FIG. 5 illustrates one or more modes of operation for one implementation of the tester.

Referring now to FIG. 5, there are illustrated one or more modes of operation for one implementation of the tester. The tester delivers a voltage waveform to the cell and monitors both the voltage across the cell and the current through it. As the voltage across the cell varies, the cell might be "triggered" into a state change, which is characterized by a resistance change of three or more (e.g., up to six) orders of magnitude. The tester also records current (I) and voltage (V) values as digitized samples for further processing.

Operational modes are defined by various parameters. FIG. 5 shows a 5-stage hierarchy of programmable/selectable parameters that determine specific modes of operation.

At the top is an application decision 500. The cell can be tested in the context of program/erase (PE) behavior, endurance behavior (END), and retention behavior (RET). Each application facilitates different "runs" through the cycles, and hence, different data gathering. For example, selecting PE initiates a complete data acquisition process. Selecting END initiates a large number of cycles, but data gathering is not as detailed as for the PE test. Selecting RET initiates repetitive reads until a failure is detected.

A repetition stage 502 is the next decision stage, and follows the application stage 500. A cycle is defined as the driving voltage "round trip" through a pre-defined sequence of waveforms. The cycle time is selected by the user through the parameter 'waveform repetition rate' (WRR). In one example, the tester allows four ways of delivering cycles: manual (MAN, which is a-cyclic), one-shot (ONE), burst (short (SB) and long (LB)), and continuous (CNT), where continuous can also include stop after positive signal (SPOS) or stop after negative signal (SNEG). A one-shot can be also viewed as a burst of one cycle. The WRR sets the repetition rate for PE (e.g., 10 Hz–100 MHz) and RET (e.g., 0.1 Hz). All cycles are originally identical for any selected mode, except for MAN. A short burst can be programmed to range from 2–100 cycles, for example.

A cycle functional content stage 504 follows the repetition stage 502, and allows the user to program the tester to cycle according to a number of different functions. For example, there is provided program only (PG), program and read (PGR), erase only (ERS), erase and read (ERR), PGR and ERR (FUL), Read only (RD1), and RD with Double Pulse (RD2).

A sequence of events stage 506 follows the cycle functional content stage 504 allowing further granularity in control by exposing the cycles internal composition. In one implementation, the cycle can be sliced into $i \leq 16$ segments. A trigger (TRIG) Ti starts a slice Wi. The trigger T1 starts the waveform cycle by starting slice W1, where the T1 repetition rate equals WRR. A trigger Ti, where i>1, is based on events during $W_{i-1}$ (time delay or magnitude). Cycle composition (denoted $\Sigma[Ti, Wi]$) is entered by the user before the test starts.

A last level of granularity control in this implementation is by a stage 508 that facilitates control of events within the cycle. Available waveforms for slice Wi include a DC signal, a positive ramp, and a negative ramp. Available Ti sources are delays from a previous trigger, and current/voltage threshold crossing. The user assigns various slice shape, magnitude, offset, etc., values to the Wi. The user also assigns various trigger threshold level or delay times to the various Ti.

Figure 6:
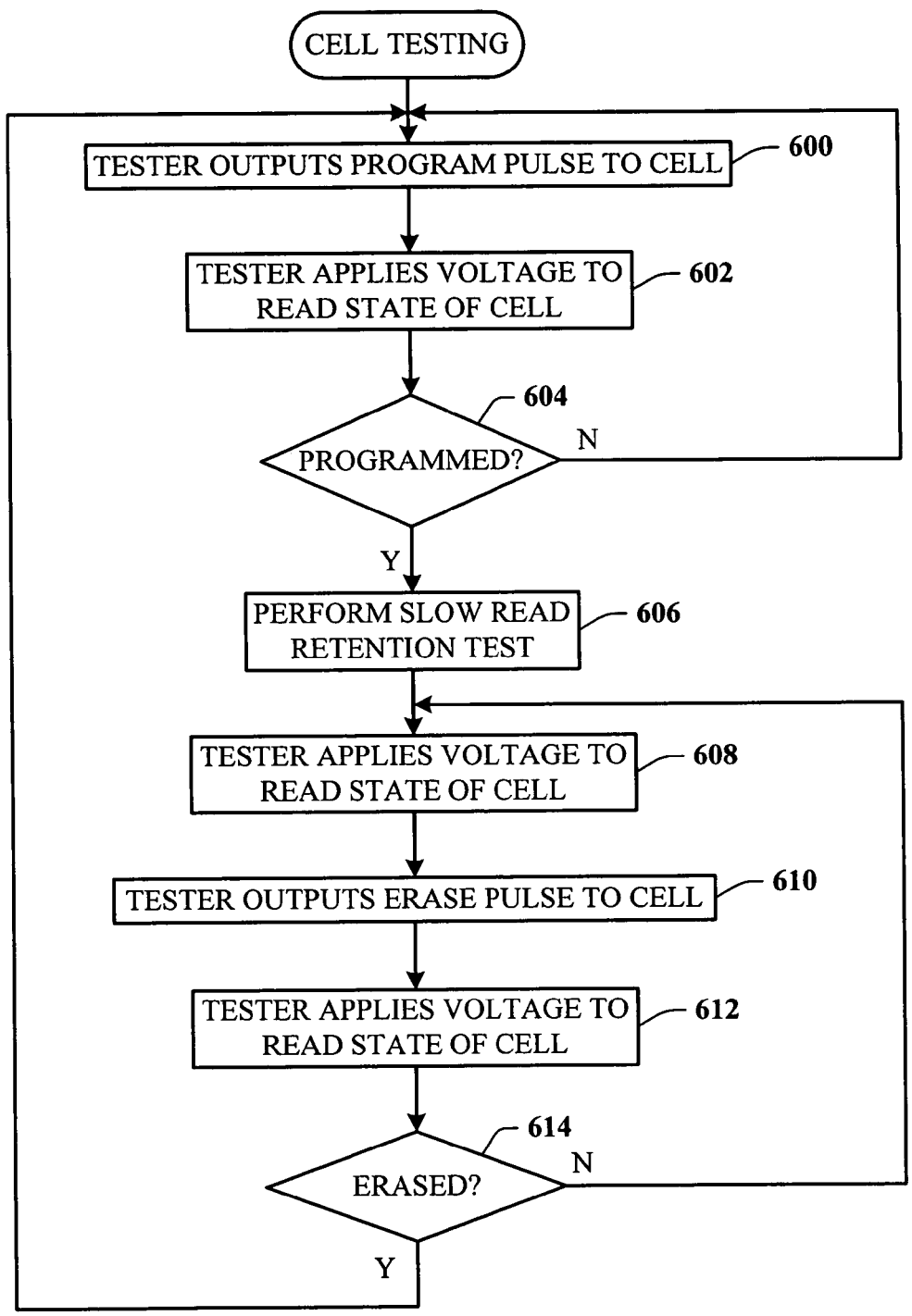
FIG. 6 illustrates a flow chart of a process for testing a polymer cell in accordance with the test system of the present invention.

Referring now to FIG. 6, there is illustrated a flow chart of a process for testing a polymer cell in accordance with the test system of the present invention. Most generally, the output waveform matches a functional plan set by the user. The plan is mainly defined by the two top levels of operational modes settings of FIG. 5. The plan of operation is set in software (SW), and controls only high-level parameters that need not be changed on the fly. The parameters can be part of system initialization and/or slow responding settings during operation. An example of such a functional plan is the flow chart of FIG. 6. At 600, the tester outputs a Program pulse to the cell. At 602, the tester applies a voltage to read the state of the cell. At 604, the tester determines if the cell is programmed. If not, flow is back to 600 to reissue the Program pulse. If yes, at 606, the tester might perform a retention test during which the tester applies voltage to the cell to read the state of the cell, as indicated at 608. At 610, the tester outputs an Erase pulse to the cell. At 612, the tester applies voltage to read the state of the cell. At 614, if the cell is determined to not be erased, flow is back to 608 to apply the voltage to read the state of the cell. If the cell has been erased, flow is from 614 back to 600 to either retest the same cell, or test another cell.

As mentioned, the tester delivers a voltage waveform to the cell and monitors both the voltage across the cell and the current through it. It is assumed that the cell has two stable states, programmed and erased, corresponding to high conductivity and low conductivity. Transitions between these two states are usually fast, covering a few orders of magnitude of conductivity change. It is also assumed that while the cell is in any of the two stable states, a small amount of voltage supplied to the cell can detect the state of the cell (by current measurement) with minimum disturbance. This is a "read" operation.

For programming, the voltage is raised until the current through the cell grows by a few orders of magnitude. Usually, cell current magnitude in the programmed state is limited by an external series resistor. The significant change in current, which reflects the cell conductivity change from very low to very high, needs to be detected by the tester and used to trigger on-the-fly changes in the voltage waveform supplied to the cell. A programmed cell will display a certain amount of retention. The tester can evaluate the length of time that the cell remains programmed. This is achieved by repeated read operations at a low repetition rate.

When a negative voltage is applied, the cell can reverse its state back to "erased". The conductivity changes from very high to very low within a short time and the cell approximates an open circuit. However, since the cell is in a high conductivity state before changing over to the erased state, it needs to be protected against damaging levels of current. The tester is capable of performing controlled, separate program, erase and read operations, as well as combinations of these operations. The functionality of the tester exhibits three main features. It drives the cell into a desired state (program, erase) and performs operations on the cell (read) while in that state, allowing for a variety of state sequencing, and speeds. The tester also delivers voltage waveforms with on-the-fly adjustments triggered by cell behavior. The tester also allows data acquisition at high speeds, including storage capability. Acquired waveforms can be analyzed off-line using various DSP (Digital Signal Processing) techniques.

In order to meet the goals related to voltage generation, the design is based on concatenating a number of waveform "slices". The output waveform driving the cell is predefined (by the user) in terms of number of slices, choice of slices, and the rules under which to switch from one slice to the next one (trigger criteria). However, except for the MANUAL mode, once the waveform generation starts, its exact shape is not under user control.

A Program operation presents some degree of hazard to cell safety. During programming, the current grows from virtually zero to a level that has to be limited by external resistors. If unprotected, the cell might allow tens or hundreds of mA to flow, which would overheat and destroy the cell. An Erase operation starts with a conductive cell (high current) to which a negative voltage is applied. During the short period of time needed by the cell to switch to low conductivity the cell voltage and current directions are negative.

Figure 7:
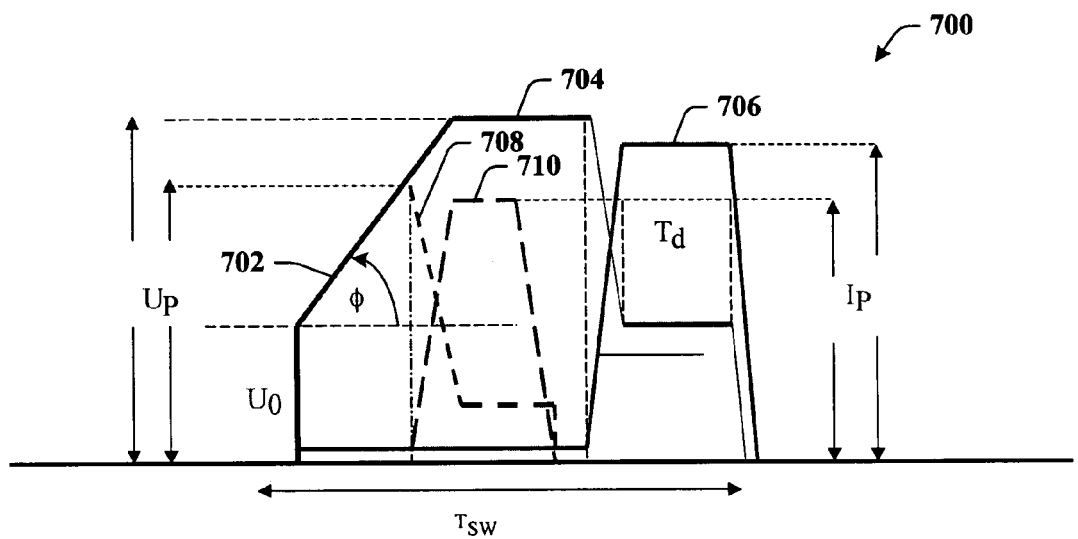
FIG. 7 illustrates a general programming waveform.

Referring now to FIG. 7, there is illustrated a general programming waveform 700. It starts with a fast rising edge $U_0$ at time=0, followed by a ramp 702. Assuming the cell changes states at some program voltage $U_P$, the voltage across the cell starts dropping as the conductivity rises. A series resistor, external to the cell, limits the program current $I_P$ magnitude. A "rear shoulder" $T_d$ can be used to enhance programming efficiency.

In one implementation, the variable parameters of the Program pulse shape are the following: $U_0$ ranges from about 0–3 volts; Up ranges from about 0–20 volts; the angle θ (phi) ranges from about 45–90 degrees; $T_d$ ranges from about 0–10 μs; $T_{SW}$ is the switching time in the ON state, ranging from about 10 ns–10 ms (where a typical time can range from about 10–100 ns); and $I_P$ is determined by the DUT/CUT. Solid lines 704 and 706 represent the respective voltage and current on a first run. Dashed lines 708 and 710 represent the respective voltage and current on a subsequent run.

Figure 8:
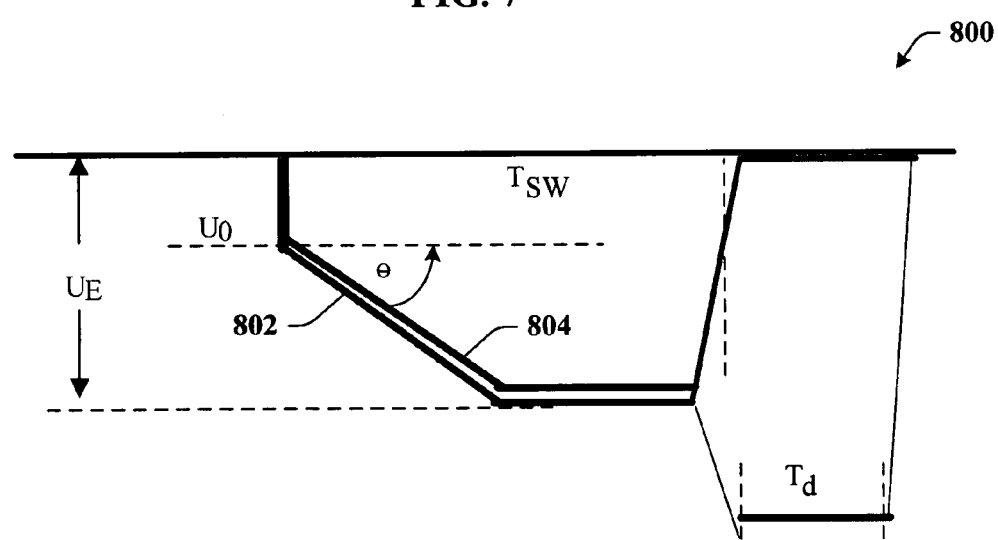
FIG. 8 illustrates a similar generic Erase waveform.

Referring now to FIG. 8, there is illustrated a similar generic Erase waveform 800. Lines 802 and 804 represent the respect current and voltage of the for the erase cycle. Variable parameters for the Erase pulse include the following: $U_0$ ranges from about 0–3 volts; $U_E$ ranges from about 0–20 volts; the angle θ (theta) ranges from about 45–90 degree; the time $T_d$ ranges from about 0–10 μs; and $T_{SW}$ is the switching time in the OFF state, ranging from about 10 ns–10 ms (where a typical time can range from about 10–100 ns).

Read operations of a programmed cell are carefully performed with very low voltage (tens of mV) to limit cell current and power dissipation. Following are example waveforms that can be assembled using the slice/trigger concept, covering most of the required needs.

Figure 9:
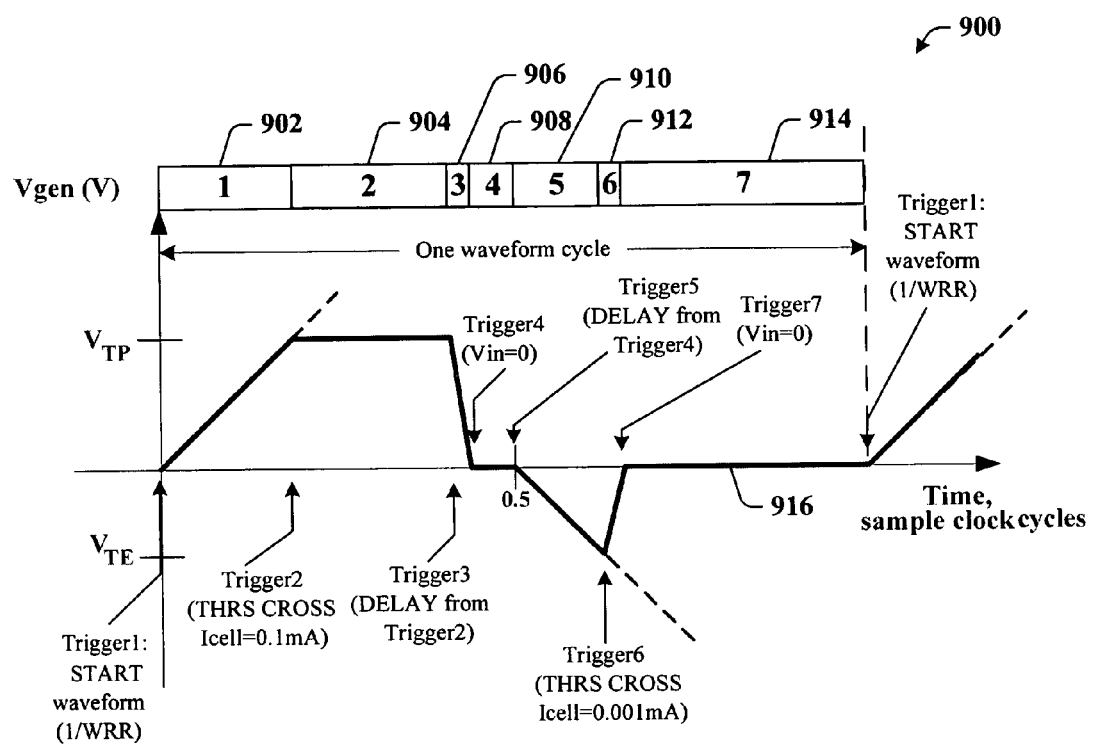
FIG. 9 illustrates a process for defining and building a waveform, which is a single cycle Program, DC sustain, and Erase.

Referring now to FIG. 9, there is illustrated a process for defining and building a waveform 900, which is a single cycle Program, DC sustain, and Erase. Following are some initial assumptions. External events are of two kinds: the cell current crosses a Program threshold (e.g., 10 μA–100 μA), and the cell current crosses an Erase threshold (e.g., 1 μA–10 μA). Internal events can be a delay from a previous trigger in clock cycles (e.g., 100 cycles corresponds to 1 μsec@100 MSamples/sec sampling rate), and Vgen reaches a predefined level (usually 0). Trigger1 is the start of the waveform cycle, and is generated unconditionally every 1/WRR seconds (or the equivalent number of sampling cycles). To implement the fastest transition times (required by voltage changes between consecutive samples), the slice can be defined as: Vinitial=V (at trigger time); and Slope≧abs (40V/sample). At the UI level, the user definition choices for maximum slope changes can be +MAX and −MAX slopes. Every slice has a default internal trigger (delay-or-Vg); in addition, some slices are expecting external event triggers before the internal trigger.

Referring again to FIG. 9, Trigger1 occurs at an initial START time, which starts the first waveform slice 902. The voltage rises to a Program threshold (VTP) level at which time Trigger2 might be generated if the cell state changes. As an example, the waveform might be programmed to level off after Trigger2, which is shown as slice 904 (where Icell is about 0.1 mA). At a certain delay from Trigger2, Trigger3 initiates a third slice 906, and the waveform drops back to the zero level. When the trailing edge reaches the zero level, a Trigger4 initiates a fourth slice 908 for a predetermined delay in time to a Trigger5. At Trigger5, a fifth slice 910 is initiated off the falling slope of the ramp waveform to a lower Erase threshold ($V_{TE}$), at which point a Trigger6 might occur (where Icell is about 0.001 mA), marking a start of the sixth slice 912. A slope polarity change occurs at Trigger6, with the waveform rising back to the zero level, initiating a Trigger7 for the start of a seventh slice 914. For the remaining cycle time, the waveform is at the zero level until the next Trigger1, which is generated unconditionally every 1/WRR seconds. A heavy solid line 916 represents the resulting waveform.

User parameters for any given job include the following: the Sampling Rate (SR), Waveform Repetition Rate (WRR), Waveform repetitions ($N_w$/JOB), Test goals, etc.; from SR and WRR, determine the waveform cycle time ($T_w$) and the number of samples in the cycle ($N_s$/CYCLE). It is convenient to convert all time-related parameters into number of samples ($N_s$); this way the main clock can be adjusted while maintaining timing relationships among slices and triggers. The design allows for sixteen triggers and sixteen corresponding slices per waveform, but this is only an application choice. The same design can be applied to other numbers of slices and triggers.

User parameters for each Trigger include the following: Internal—DELAY from last trigger (is about 10–10 M nsec, at 24 bits) and the Vg threshold in mV (ranges from +/−2V, for 12 or more bits); External—CELL CURRENT PROGRAM threshold (IP) in µA (ranges from about 10 µA–100 αA, at 10 or more bits), and the CELL CURRENT ERASE threshold (IE) in µA (ranges from about 1 µA–100 µA, at 8 or more bits).

User parameters for every Slice include the following: initial point—the last value at Trigger time (is 1 bit), and predefined in mV (ranging from about +/−20V, at 16 or more bits); and, slope in mV/nsec (or V/µsec) or mV/sample (about 1–10000, at 16 bits or more) Following is a table of parameters and examples.

| Slice | Parameter | Examples |
|---|---|---|
| 1a | Trigger 1 is START of the waveform cycle | t = 0, 1/WRR, 2/WRR, 3/WRR, ... |
| | Case 11: External event triggers (Icell >= threshold) | I threshold (Ith1 = 0.1mA) |
| | Case 12: External event triggers (Icell <= threshold) | I threshold (Ith1 = 0.001mA) |
| | Case 13: No event? | D1 = 1000 samples |
| 1b | Slice 1 (initial point, slope) | t = 0, Vinitial = 0, S1 = 10mV/sample |
| 2a | Case 21: External event triggers (Icell >= threshold) | I threshold (Ith2 = 0.1mA) |
| | Case 22: External event triggers (Icell <= threshold) | I threshold (Ith2 = 0.001mA) |
| | Case 23: No event? Then DELAY trigger (T >= Delay from Trigger 1) | D2 = 200 samples |
| 2b | 2b. Slice 2 (initial point, slope) | Vinitial = Vg at Trigger 2, S2 = 0V/sample |
| 3a | Case 31: External event triggers (Icell >= threshold) Case 32: External event triggers (Icell <= threshold) Case 33: No event? Then DELAY trigger (T >= Delay from Trigger 2) | I threshold (Ith3 = 0.1mA) I threshold (Ith3 = 0.001mA) D3 = 500samples |
| 3b | Slice 3 (initial point, slope) | Vinitial = Vg at Trigger 3, S3 = −40V/sample |
| 4a | Case 41: External event triggers (Icell >= threshold) | I threshold (Ith4 = 0.1mA) |
| | Case 42: External event triggers (Icell <= threshold | I threshold (Ith4 = 0.001mA) |
| | Case 43: No event? Then Vg trigger (Vg = level) | Vg4 = 0 |
| 4b | Slice 4 (initial point, slope) | Vinitial = V at Trigger 4, S4 = 0V/sample |
| 5a | Case 51: External event triggers (Icell >= threshold) | I threshold (Ith5 = 0.1mA) I threshold (Ith5 = 0.001mA) |
| | Case 52: External event triggers (Icell <= threshold) | D5 = 200 samples |
| | Case 53: No event? Then DELAY trigger (T >= Delay from Trigger 4) | |
| 5b | Slice 5 (initial point, slope) | Vinitial = Vg at Trigger 5, S5 = −50mV/sample |
| 6a | Case 61: External event triggers (Icell >= threshold) | I threshold (Ith6 = 0.1mA) |
| | Case 62: External event triggers (Icell <= threshold) | I threshold (Ith6 = 0.001mA) |
| | Case 63: No event? Then Vg trigger (Vg = level) | Vg6 = 300mV |
| 6b | Slice 6 (initial point, slope) | Vinitial = Vg at Trigger 6, S6 = +40V/sample |
| 7a | Case 71: External event triggers (Icell >= threshold) | I threshold (Ith7 = 0.1mA) |
| | Case 72: External event triggers (Icell <= threshold) | I threshold (Ith7 = 0.001mA) |
| | Case 73: No event? Then Vg trigger (Vg = level) | Vg7 = 0 |
| 7b | Slice 7 (initial point, slope) | Vinitial = Vg at Trigger 7, S7 = 0V/sample |

Assembly of Slices The voltage signal delivered to the cell is pre-assembled from slices of standard waveforms available in the waveform memory. The user selects the sequence in advance (e.g., positive ramp, DC, negative ramp, and DC). The user also selects the events that trigger switching from one slice to the next. The following lists the slices required for five of the most popular target waveforms. Using the same technique, however, it is possible to generate a wide variety of waveforms.

| SLICE SEQUENCE | COMMENTS | CORRESPONDING TRIGGER SEQUENCE | COMMENTS |
|---|---|---|---|
| 1 RMP+, DC, BL | RMP = ramp | CSRT, IMG+, TIME, | CSRT = Cycle start |
| 2 RMP+, RMP−, BL | DC = constant | CSRT, IMG+, ZERO | IMG = current threshold |
| 3 RMP−, BL | BL = baseline, zero | CSRT, IMG− | ZERO = waveform reaches BL (zero) |
| 4 RMP+, DC, BL, RMP−, BL | RD = read level (special case of DC) | CSRT, IMG+, TIME, TIME, IMG− | |
| 5 DC, BL, RD, BL, DC, BL, RD, BL | | CSRT, IMG+, TIME, TIME, TIME, IMG−, TIME, TIME | |

The following table shows ordered event sequences of triggers and slices for the five waveforms.

| TRG1 | SLC1 | TRG2 | SLC2 | TRIG3 | SLC3 | TRIG4 | SLC4 | TRIG5 | SLC5 | TRIG6 | SLC6 | TRIG7 | SLC7 | TRIG8 | SLC8 |
|---|---|---|---|---|---|---|---|---|---|---|---|---|---|---|---|
| CSRT | RMP+ | IMG+ | DC | TIME | BL | | | | | | | | | | |
| CSRT | RMP+ | IMG+ | RMP− | ZERO | BL | | | | | | | | | | |
| CSRT | RMP− | IMG− | BL | | | | | | | | | | | | |
| CSRT | RMP+ | IMG+ | DC | TIME | BL | TIME | RMP− | IMG− | BL | | | | | | |
| CSRT | DC | IMG+ | BL | TIME | RD | TIME | BL | TIME | DC | IMG− | BL | TIME | RD | TIME | BL |

Amplitude Control

Since the basic shapes are DC and ramp, it is relatively easy to define voltage magnitude for various slices. The following table summarizes the options. Baseline (BL) is essentially a DC slice, but it is specifically named because it serves as the reference voltage for the entire waveform. Read pulses are DC slices as well, having a characteristically low amplitude (of about 20–200 mV) and higher resolution.

Threshold-based triggers are also defined by voltage/current magnitudes; these values are fed to comparator inputs as a reference. In some cases, a slice can be defined as DC without knowing the amplitude in advance. When the slice is triggered into the waveform, the DC value of the voltage can be decided by the last value of the waveform before triggering. In that case, the value will be calculated on the fly.

| NAME | WAVE-FORM | COMMENTS |
|---|---|---|
| 1 Baseline | BL | This is the offset DC voltage of any selected waveform. Default value is 0 Volts. |
| 2 Ramp waveform amplitude | RMP | RMP refers to the amplitude of the ramp waveform (difference between peak and baseline). RMP <= 15V |
| | SLPE | The slope of the ramp is specified by the user entry of V/nsec parameter. |
| 3 DC level | DC | DC <= 15V |

Figure 10:
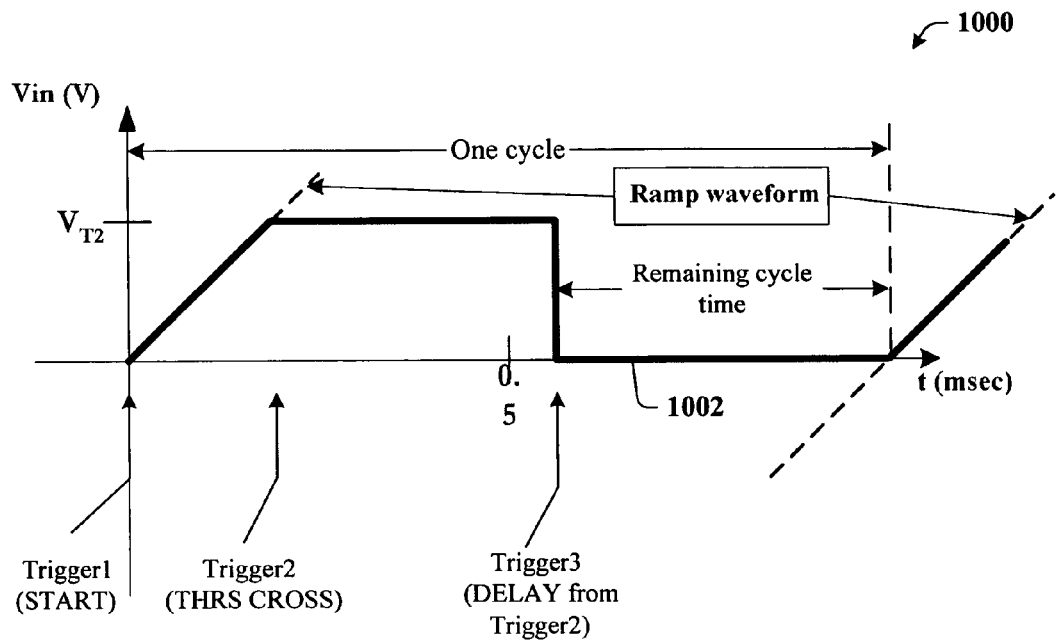
FIG. 10 illustrates a sample waveform for a single cycle Program, with a sustaining DC voltage.

Referring now to FIG. 10, there is illustrated a sample waveform 1000 for a single cycle Program, with a sustaining DC voltage. At a Trigger1 (START), a ramp waveform is applied to the DUT/CUT, and the voltage starts ramping up until a threshold voltage (VT2) is reached. At Trigger2 (THRS CROSS), a threshold crossing occurs at $V_{T2}$. At Trigger 3 (DELAY), a falling edge occurs at the expiration of a delay time from the event of Trigger2. The remaining cycle time is at an initial level until the start of the next cycle. A heavy solid line 1002 represents the resulting waveform.

Figure 11:
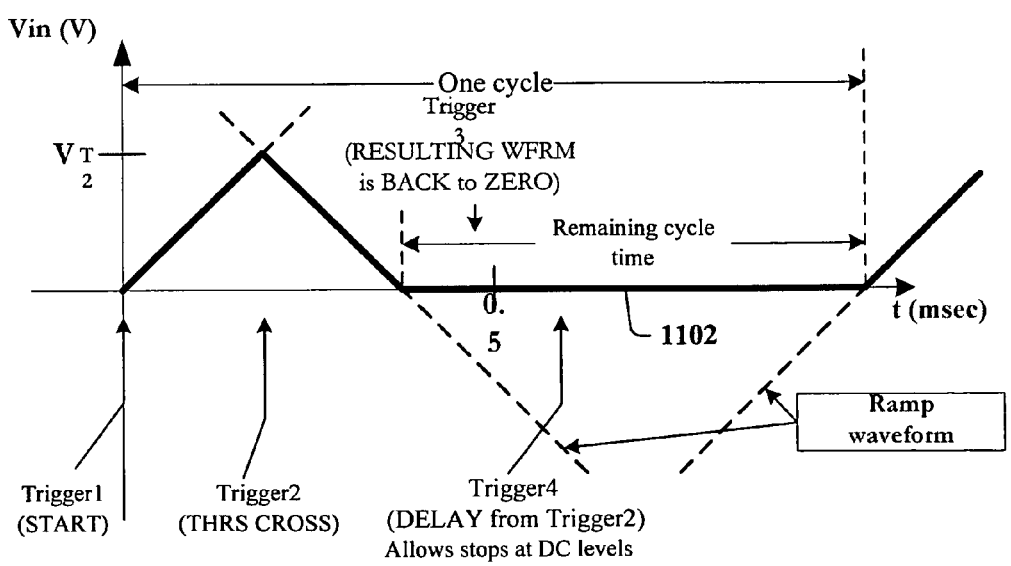
FIG. 11 illustrates a sample waveform for a single cycle Program, with a sustaining slowly declining voltage.

Referring now to FIG. 11, there is illustrated a sample waveform 1100 for a single cycle Program, with a sustaining slowly declining voltage. At a Trigger1 (START), a ramp waveform is applied to the DUT/CUT, and the voltage starts ramping up until a threshold voltage ($V_{T2}$) is reached. At Trigger2 (THRS CROSS), a threshold crossing occurs at VT2, and the voltage begins a slow decline to zero volts. At Trigger3, the resulting waveform is back to zero for the remaining cycle time. At Trigger4, which is some DELAY from Trigger2, allows the system to stop at the DC level of the remaining cycle. The remaining cycle time is at an initial level until the start of the next cycle. A heavy solid line 1102 represents the resulting waveform.

Figure 12:
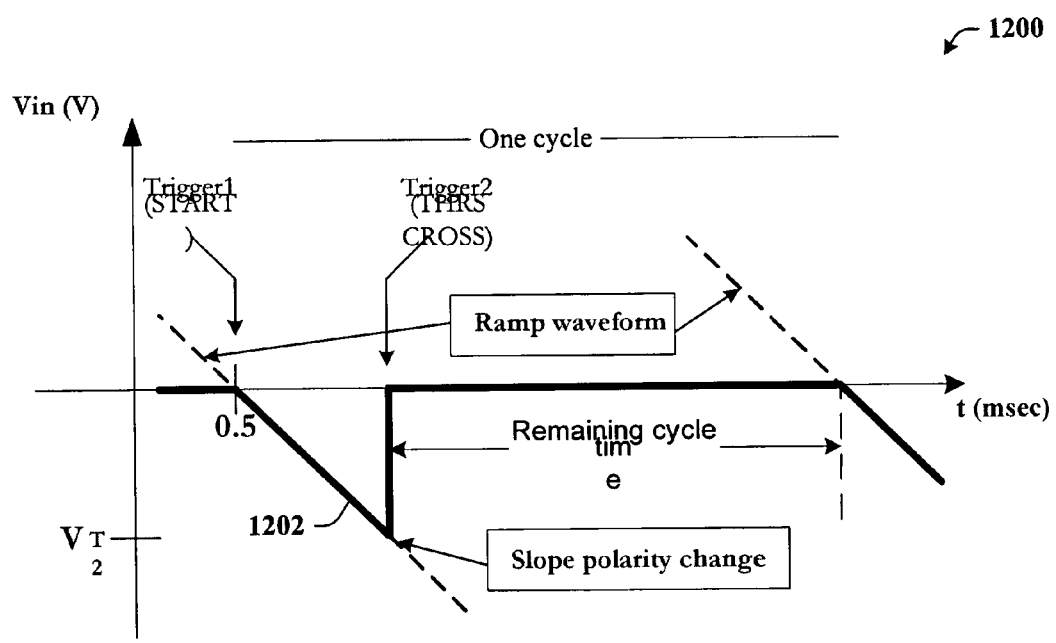
FIG. 12 illustrates a sample waveform for a single cycle Erase, with no sustaining voltage.

Referring now to FIG. 12, there is illustrated a sample waveform 1200 for a single cycle Erase, with no sustaining voltage. Trigger1 starts at some time when the falling edge of the ramp signal reaches a zero voltage level. Some time later, at the intersection of the ramp and a threshold voltage ($V_{T2}$), a slope polarity change occurs, which is Trigger2, and the voltage level rises back to the zero level for the remaining cycle time. A heavy solid line 1202 represents the resulting waveform.

Figure 13:
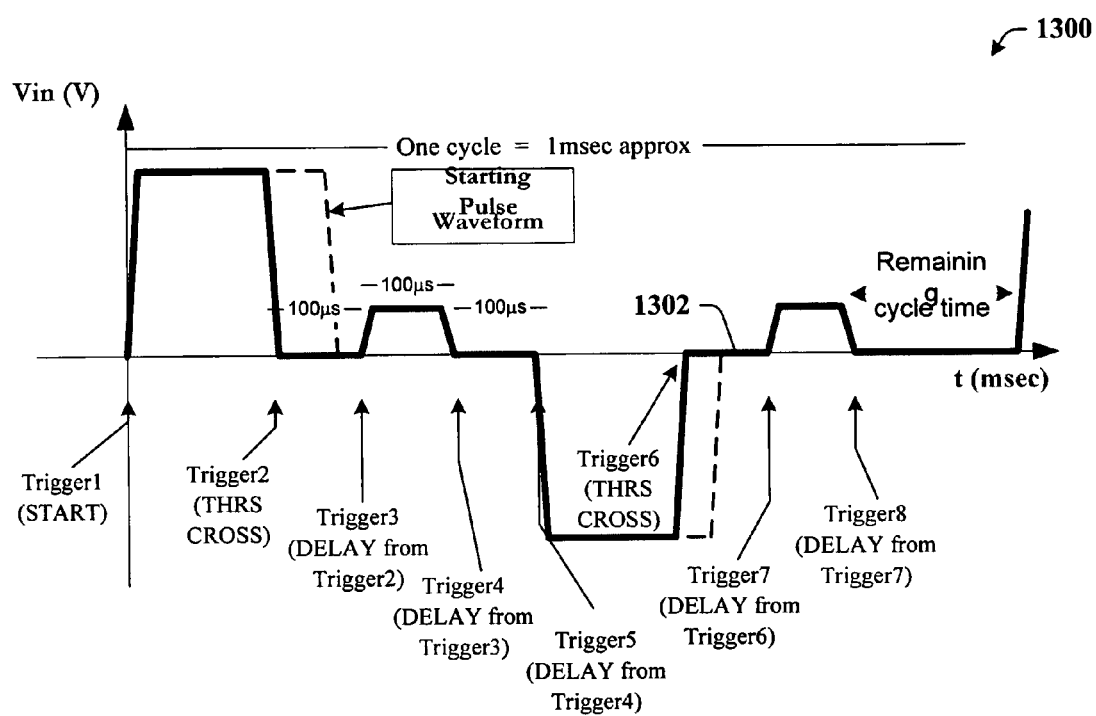
FIG. 13 illustrates a sample waveform for a single cycle of a Fast Program, DC sustain, Read, Fast Erase, and Read.

Referring now to FIG. 13, there is illustrated a sample waveform 1300 for a single cycle of a Fast Program, DC sustain, Read, Fast Erase, and Read. At Trigger1, the cycle starts, and the waveform rises to predefined maximum level. At a Trigger2, the trailing edge of the pulse meets the zero level. At a Trigger3, which is some delay in time from Trigger2, the waveform rises to a predetermined level, less than the maximum level. At a predetermined delay in time from Trigger3, a Trigger4 occurs when the trailing edge of the pulse meets the zero level. At a predetermined delay in time from Trigger4, a Trigger5 occurs when the pulse goes negative. At the trailing edge of the pulse, a Trigger6 occurs when the pulse reaches the zero level. At some delay in time from Trigger6, a Trigger7 occurs, and the pulse rises to a predetermined level less than the maximum. At a delay in time from Trigger7, Trigger8 occurs when the failing edge of the pulse reaches the zero level for the remaining cycle time. A heavy solid line 1302 represents the resulting waveform.

Figure 14A:
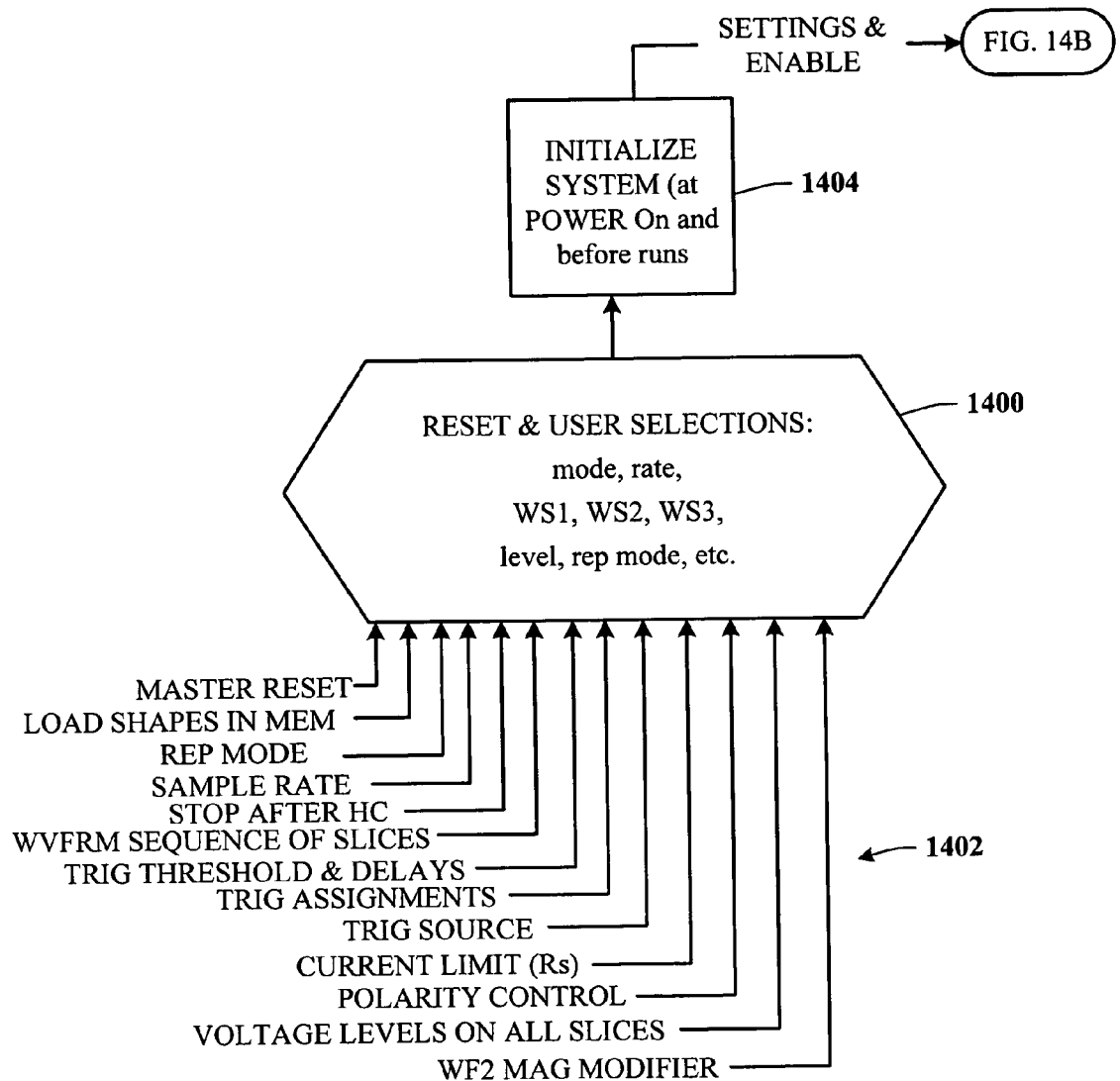
FIG. 14A illustrates a Reset and User Selections input block for an in-cycle flow chart for generating a 3-stage waveform in accordance with the present invention.

Referring now to FIG. 14A, there is illustrated a Reset and User Selections input block 1400 for an in-cycle flow chart for generating a 3-stage waveform in accordance with the present invention. The input block 1400 can accommodate at least the following inputs 1402: a Master Reset; Load Shapes in Memory; Repeat Mode; Sample Rate; Stop After HC; Waveform Sequence of Slices; Trigger Threshold and Delays; Trigger Assignments; Trigger Source; Current Limit; Polarity Control; Voltage Levels for All Slices; and a Waveform Magnitude Modifier. The inputs 1402 are implemented during power initialization by a system initialization block 1404, after which these settings are passed for processing by the tester subsystems.

Figure 14B:
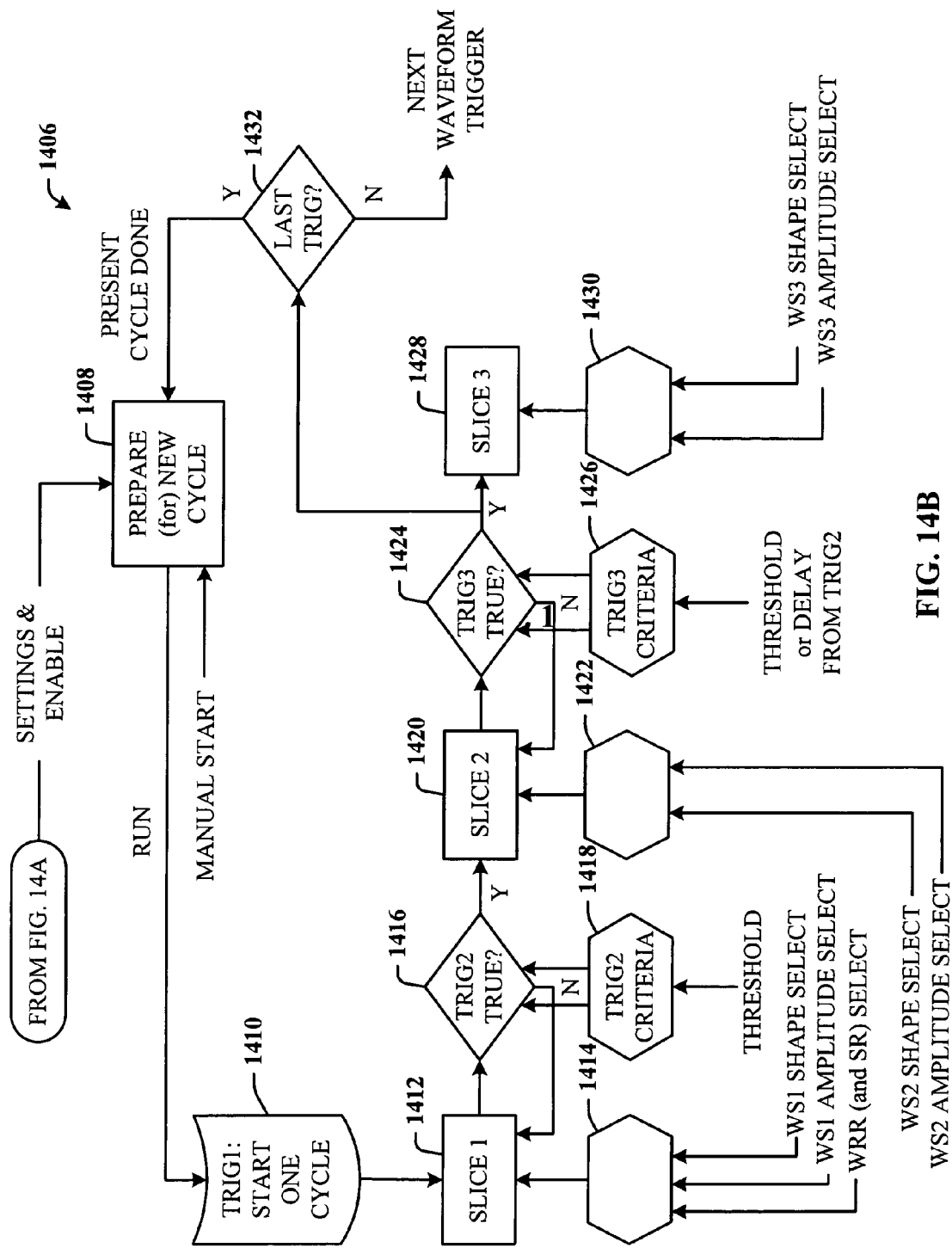
FIG. 14B illustrates the remaining in-cycle flow chart for generating a 3-stage waveform in accordance with the present invention.

Referring now to FIG. 14B, there is illustrated the remaining in-cycle flow chart 1406 for generating a 3-stage waveform in accordance with the present invention. The logic sequence of generating a waveform and the additional steps/settings are summarized herein. The settings (of FIG. 14A) are enabled and forwarded to a Prepare New Cycle block 1408, after which the tester can enable Trigger1 at 1410 for the start of one cycle. At 1412, the first slice (SLICE1) is enabled according to the received settings, and other input parameters at 1414 that include WS1 Shape Select, WS1 Amplitude Select, and WRR (and SR) Select.

At 1416, the tester determines if the criteria for Trigger2 are true. This is based on Trigger2 criteria received from a block 1418, which includes Trigger2 threshold information. If not, the system continues to monitor the Slice1 block 1412. If so, flow is to 1420 to process a second slice (SLICE2). Input parameters at 1422 for the second slice 1420 include WS2 Shape Select, and WS2 Amplitude select. At 1424, the tester determines if the criteria for Trigger3 are true. This is based on Trigger3 criteria received from a block 1426, which includes Trigger2 threshold or Delay information from Trigger2. If not, the system continues to monitor the Slice2 block 1420. If so, flow is to 1428 to process a third slice (SLICE3). Input parameters at 1430 for the third slice 1428 include WS3 Shape Select, and WS3 Amplitude select. The output from block 1424 is also fed to block 1432 to determine if this is the last trigger to be processed. If not, the next trigger is processed. If so, flow is back to 1408 to signal that the present cycle has completed, and to prepare for a new cycle. The prepare block 1408 also includes a manual start input for manually initiating a new cycle.

Some of the strategies in delivering the right slice with minimum delay are the following: TRIG1 starts the cycle, and the first waveform slice (e.g., a ramp signal), where the cycle time is user selected and determines the frequency of TRIG1; at TRIG2, the last value of the ramp is stored; if WS2 is a negative-slope ramp, then the counter running the ROM addresses counts in reverse; if WS2 is DC, then the counter is stopped and the output is steady at the last value, and a one-sample-long calculation step adjusts the output magnitude, if needed; TRIG3 can be a time interval from TRIG2 or a zero-crossing of the waveform, which resets the waveform to zero or another DC value.

All user-selected parameters for the specific run are stored in memory. As part of the initialization of any run, parameters are converted to a series of samples representing various slices ($WS_i$) that include specified amplitude and slope adjustments, which are then loaded in a fast buffer memory for read-out at the sampling rate (SR)—e.g., every ten nanoseconds.

Figure 15:
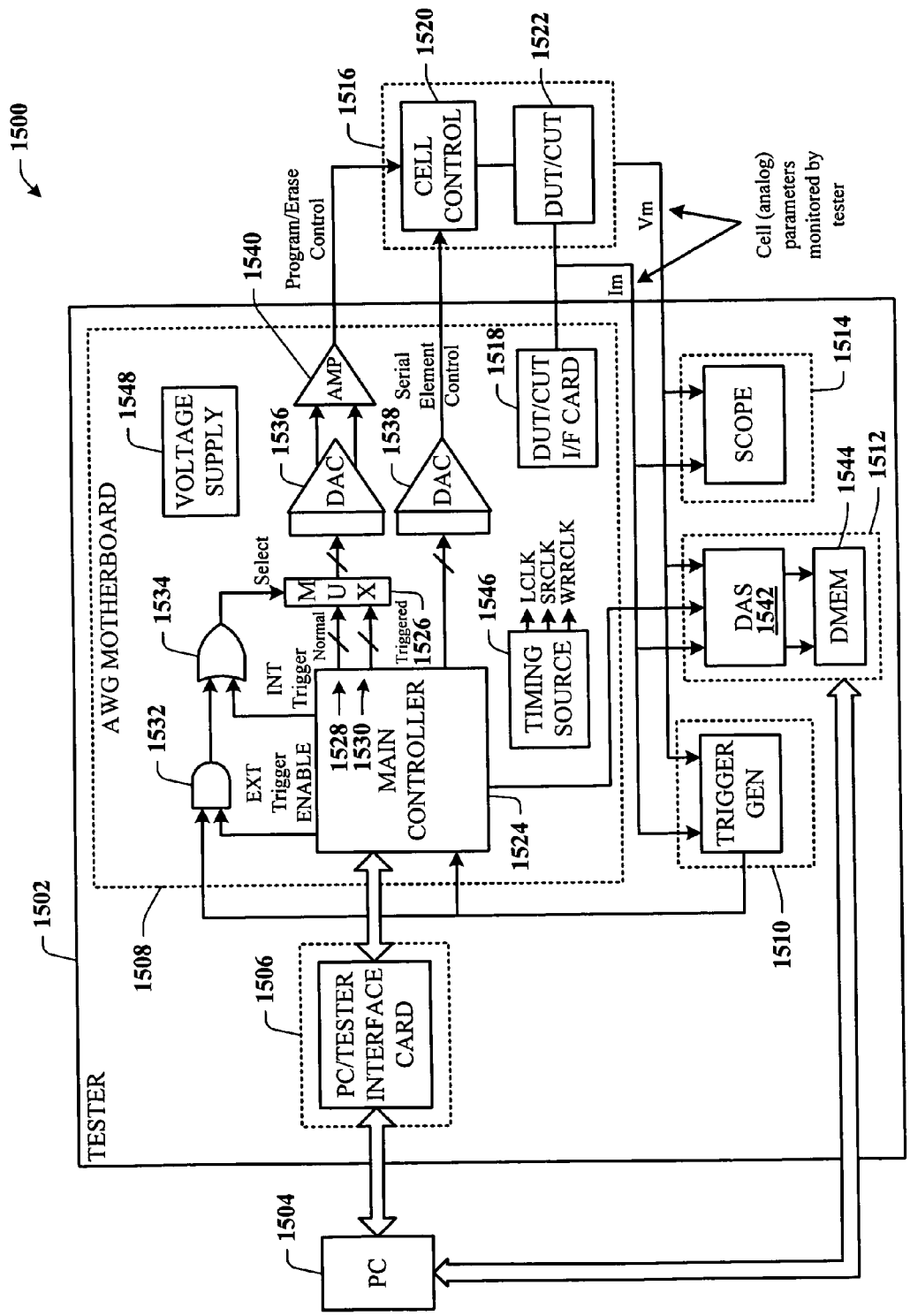
FIG. 15 illustrates a block diagram of one implementation of a test system of the present invention.

Referring now to FIG. 15, there is illustrated a block diagram of one implementation of a test system 1500 of the present invention. The test system includes a tester 1502 that is essentially a combination of a waveform generator and a waveform digitizer. These two main functional components are interconnected to allow for changes in the generated waveform triggered by values measured in the digitized waveform. Since the triggering and the changes in the waveforms require relatively fast response, a fast switch is used for selecting slices of predetermined waveforms (e.g., ramp and DC) according to a user-selected order. Trigger occurrences are expected within a time range. Using on-the-fly waveform slice selection (within one sample time), the tester can generate waveforms as shown in FIGS. 10–14.

The tester 1502 allows user control on a wide variety of test parameters through the USER I/F. Some of the controls are digital (binary or otherwise) and some are analog. The user has a choice of entering parameters via a PC interface, or directly on tester panel. After selections are made, the tester 1502 generates either one cycle of the waveform, a burst of 2–100 cycles, or will run continuously until stopped by the user. There is also a non-cyclic mode that allows the user to manually control the waveform.

In this particular implementation, a tester 1502 houses various circuits, boards, and I/O connectors, and interfaces to an external computer 1504 via a PC/Tester interface card 1506. Communications can be accommodated using conventional bus architectures. Note, however, as previously indicated, the computer 1504 can be implemented into the tester 1502, or vice versa. It is to be appreciated by one skilled in the art that the complete tester circuitry can be developed into a single ASIC (Application Specific Integrated Circuit) chip that facilitates employing the tester in the computer 1504, or other suitable computing devices and systems.

The tester 1502 includes an AWG motherboard 1508 that includes a number of circuits for generating and controlling waveforms, and further accommodates a number of subsystems in the form factor of daughter cards. For example, the daughter cards can include the interface card 1506, a trigger generation card 1510, a DAS/DMEM (Data Memory) card 1512, and an oscilloscope card 1514. The tester 1502 interfaces to an external DUT/CUT subsystem 1516 via an internal DUT/CUT interface card 1518, which DUT/CUT subsystem 1516 includes the DUT/CUT 1522 and a cell control module 1520 that interfaces to the DUT/CUT 1522.

The motherboard 1508 includes a main controller 1524 that controls all motherboard processes. The main controller can be a FPGA (Field Programmable Gate Array) device (or other comparable device such as a CPLD—Complex Programmable Logic Device) that allows the user to implement changes and updates to the control code thereof. The controller 1524 functions as the principal interface of the motherboard 1508 to the external PC 1504 via the interface 1506. In this particular implementation, the PC facilitates test management and control utilizing a UI, an interface to the PC/Tester card 1506, a display, storage, and post-processing for the DAS subsystem. In addition to functioning as the interface between the PC 1504 and the tester 1502, the PC/Tester interface 1506 also facilitates the interface to the AWG motherboard and display status. The main controller 1524 processes clock generation signals, data exchange with the PC/Tester interface 1506 (including waveform parameters and other status/control signals) and, waveform synthesis and control. This includes processing slice and trigger sequences, calculating N and T samples (e.g., at about 10 ns), generating internal triggers, filters (for a DSP, for example), and Start/Stop/Repeat waveform control, as needed. The main controller 1524 can operate to control data processing and signals of each of the daughter cards, and/or coordinate data processing and control with those daughter cards that have on-board processors.

The main controller 1524 provides dual outputs to a multiplexer ("mux") 1526: a normal multibit output 1528 and a triggered multibit output 1530. Either of the outputs (1528 and 1530) is selected under control of the main controller 1524 using AND logic 1532 and OR logic 1534. One input of the AND logic 1532 is received for the trigger generator 1510 with another input received from the main controller 1524 as an external trigger enable (EXT Trigger ENABLE) control. An output of the AND logic serves as an input to the OR logic 1534 with another input from the main controller 1524 as an internal trigger (INT Trigger) control. An output of the OR logic 1534 serves as the select control to the mux 1526. The mux 1526 is a fast device driven by the trigger conditions. The main controller 1524 calculates and prepares both the normal and triggered sample outputs before the next sample clock (e.g., within 10 nsec). In this implementation, the mux 1526 is faster than about 5 ns. That is, the sum of the cell switching time plus the propagation delay (for the comparator and flip-flops) is less than 5 ns. The interface 1506 forwards the sequence of triggers for waveform selection from the PC 1504.

The motherboard circuitry also includes two DACs: a first DAC 1536 and a second DAC 1538. The first DAC receives one of the multibit outputs of the main controller 1524 via the mux 1526. The first DAC 1536 outputs an analog signal to amplifier circuitry 1540 for Program/Erase control to the cell control module 1520. In one implementation, the amplifier output has a maximum peak-to-peak voltage of about twenty volts, and a no-signal output of about zero volts. The second DAC 1538 receives a multibit input directly from the main controller 1524, which DAC output is used as a serial element control for selection of the resistive elements of the cell control module 1520. The DUT/CUT interface card 1518 interfaces to the DUT/CUT 1522 to facilitate application of a voltage bias across a current resistor to the cell(s) of the DUT/CUT 1522.

The trigger generation card 1510 receives as inputs both analog current (Im) and analog voltage (Vm) signals that correspond to the current to the DUT/CUT interface 1518 and voltage applied to the DUT/CUT 1522. Using these inputs, the generator 1510 provides the appropriate output to the AND logic 1532. The current and voltage are also received by the scope card 1514 and the DAS card 1512. The DAS card 1512 includes the DAS subsystem 1542 and a DMEM subsystem 1544. The DAS subsystem 1542 is the central data acquisition system that receives and processes the current and voltage of the DUT/CUT 1522, and stores the results in the on-board DMEM 1512. The DAS subsystem 1542 receives control signals from the main controller 1524 related at least to the start and stop of acquiring data.

The scope 1514 receives both the analog current and voltage for digital processing and presentation. In support thereof, the scope 1524 also includes a scope memory for storing digitized data.

The AWG motherboard 1508 also includes a clock source 1546 for providing timing signals to on-board systems, including signals for clocking logic (LCLK), sample rate clocking (SRCLK), and clocking for the wave repetition rate (WRRCLK), which can be user selectable. A voltage supply 1548 provides various DC voltages (e.g., bipolar) for motherboard circuits and logic.

Figure 16:
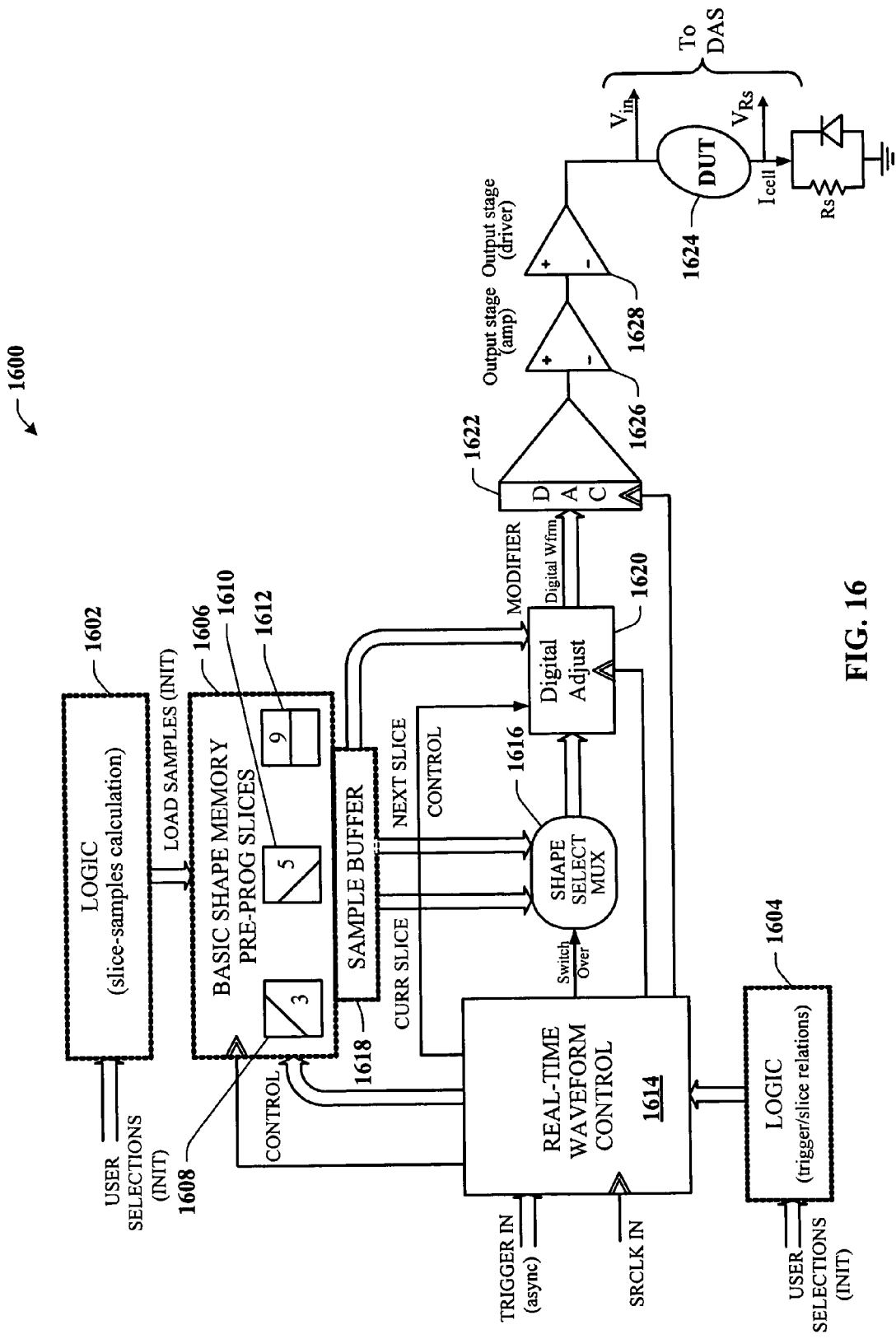
FIG. 16 illustrates a signal path diagram that represents a fast signal path during waveform generation.

Referring now to FIG. 16, there is illustrated a signal path diagram 1600 that represents a fast signal path during waveform generation. A first logic block 1602 receives user selections during system initialization, and performs slice-sample calculations. A second logic 1604 also uses the user selections for determining trigger/slice relationships. The output of the first logic 1602 is samples that are loaded into a memory 1606 via a bus during initialization to store basic waveform shapes, including a positive ramp waveform 1608, negative ramp waveform 1610, and DC waveform 1612. Any slice of a waveform is a combination of these three basic waveform shapes.

The second logic block 1604 loads the trigger/slice relationship data via a bus into a real-time waveform control block 1614. The control block 1614 receives as inputs an SRCLK clock signal, and an asynchronous multibit Trigger IN signal. The control block 1614 communicates clocking signals to the memory block 1606, and also passes additional control information via a bus to the memory block 1606.

An output of the control block 1614 is a switch-over signal to a shape select mux 1616. The mux also receives multibit data over two separate buses from a sample buffer 1618, which buffer 1618 is an output of the memory block 1606. The sample buffer 1618 provides current slice data over one of the buses to the mux 1616, and next slice data over the other bus to the mux 1616.

The control block 1614 also provides clocking signals to a digital adjust block 1620 and a DAC 1622. An output of the mux 1616 is slice data (current or next) over a bus to the digital adjust block 1620. The control block 1614 also provides a control signal to the digital adjust block 1620 to facilitate adjusting offset. The buffer 1618 also provides buffer data directly to the digital adjust block 1620 via another bus. An output of the digital adjust block 1620 is a modified multibit-wide digital waveform to the DAC 1622. The DAC 1622 converts the digital input to an analog output signal for application to a DUT/CUT 1624 through an amplifier output stage 1626 and an output driver stage 1628. The input voltage (Vin) and a voltage ($V_{Rs}$) (derived from the DUT/CUT current) are both passed to the DAS for further processing and analysis.

The analog output is delivered to the DUT/CUT by a fast DAC. The two amplifiers amplify the signal to the levels of about 15V and current drive capability for driving many cells in parallel, e.g., sixteen cells in parallel.

The digital blocks assemble the slices into a continuous waveform sampled at, for example, 100 Msps. The rules of assembly have been described hereinabove and are based on user selections (made off-line during initialization) and the trigger signals received from the DAS. Throughout the signal path, which includes Waveform Control, MUX, Digital Adjust, Sample Buffer and the DAC, the sampling rate is supplied by the SRCLK signal (e.g., 100 Msps). The triggering functions and associated outputs need to be faster than the sample time (in this example on the order of 1–2 nsec maximum), in order to minimize uncertainty in the waveform and efficiently protect the DUT/CUT (e.g., a cell) from over current and power. However, other parts of the logic circuits can operate at a much slower speed that is selectable according to LCLK, and can be, for example, 100 MHz or less.

In one implementation, each slice contains 1 msec worth of data (or 100,000 samples). Memory size/slice is about 1.2 Mbits. The transition to the next slice is triggered, at which trigger time one of the three following cases is true. In a first case, the value of the new slice at trigger time is independent of the current slice. The value is preprogrammed as the first value of the new slice. The MUX 1616 switches over to the NEXT SLICE (e.g., at V=0).

In a second case, the value of the next slice at trigger time is equal to the value of the current slice. In this case, the value is known only at trigger time. The MUX 1616 does not switch. The next slice can be a DC shape at the last level of the current slice. It is generated by stopping the counter for address advance in the memory 1606. Another possibility is a ramp starting from the last value of the current slice. This is generated by a count up of the addresses of a negative ramp, or a count down of a positive ramp. The initial value of the negative ramp is adjusted by adding an offset in the digital adjust block 1620.

In a third case, the value of the next slice at trigger time is related to the value of the current slice, but includes also an addition/subtraction of another constant (preprogrammed) value. In this case, there is a calculation involved (that should not take longer than one sample time) that is performed through the digital adjust block 1620. The shape of the next slice is also preprogrammed and it is independent of the cases listed above. The waveform generation works in real-time, while the rest of the logic can work at a lower speed.

The waveform memory 1606 can be included in the CPLD, FPGA, or implemented in a separate memory chip(s). This memory 1606 can be relatively slow for writing and erasing purposes, but should have a fast reading portion (shown as the Sample Buffer 1618). In one implementation, for a 100 MS/sec waveform that extends 1 msec, 100 Ksamples is needed. At 12 bits/sample, 1.2 Mbit/waveform are needed. Assuming sixteen waveforms (or slices) are desired, the worst-case amount of memory 1606 is about 19.2 Mbits. Thus, as a first estimate, the shape memory 1606 can be sized to 32 Mbits of waveform storage.

The basic waveforms can be stored in the shape 1606 memory with standard offsets and amplitudes. This part of memory can be a ROM (Read-Only Memory). During the initialization of the system, the logic extracts the series of slices that are selected by the user, adjusts their amplitudes, offsets or slopes, and stores them in the Sample Buffer 1618 at the correct locations dictated by their sequencing. Some adjustments of amplitude or offset can be made on the fly by the signal path circuits. At any trigger input, the signal path logic will be ready to move to the next slice, make the necessary adjustments to it, and deliver the samples to the DAC 1622. Both the DAC 1622 and the output amplifier 1626 are off-the-shelf components. The amplifier/filter has a fixed gain. To meet the relatively high voltage output and current drive requirements, the last stage is designed with discrete components.

Figure 17:
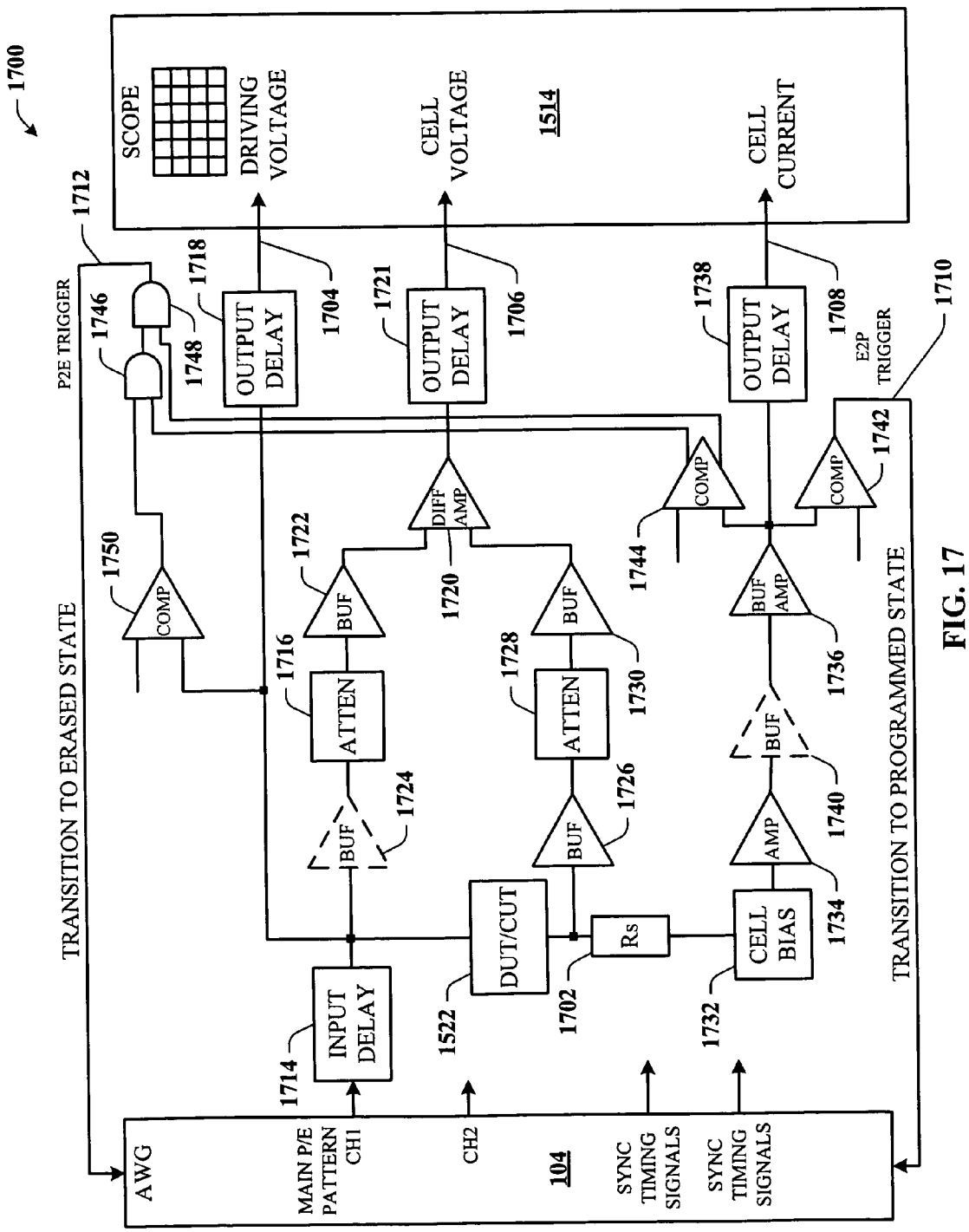
FIG. 17 illustrates a trigger board functional diagram according to the present invention, using an incremental cycling waveform of FIG. 24.
Figure 24:
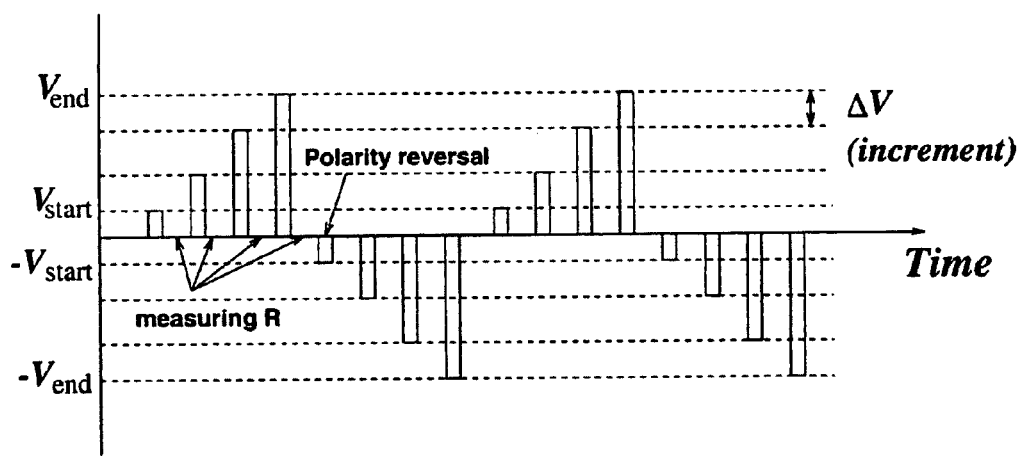
FIG. 24 illustrates a plot of an incremental cycling waveform in accordance with the present invention.

Referring now to FIG. 17, there is illustrated a trigger board functional diagram 1700 according to the present invention, using an incremental cycling waveform of FIG. 24. The interface between the AWG 104 and the trigger circuitry includes a first channel (CH1) that provides the principal output Program/Erase pattern signals to the DUT/CUT 1522. A second channel (CH2) can facilitate control of current through the DUT/CUT 1522 via a resistance 1702 (Rs). Ultimately, at least three signals will be monitored by the scope 1514: the driving voltage 1704, cell voltage 1706, and cell current 1708. Further outputs of the trigger circuitry include an Erase-to-Program transition signal 1710 and a Program-to-Erase transition signal 1712.

The output of CH1 of the AWG 104 connects to an input delay 1714 that can be achieved using coaxial cable of a predetermined length. The output of the input delay 1714 connects not only to the DUT/CUT 1522, but also to a first attenuator 1716, and a first output delay 1718 through which the driving voltage signal 1704 is passed to the scope 1514. The input and output voltage of the DUT/CUT 1522 is monitored using buffer/attenuator circuits, and eventually compared using a differential amplifier 1720. One input to the differential amplifier 1720 includes the input voltage from the AWG 104 through the first attenuator 1716, and an output buffer 1722 thereof. Note that an optional input buffer 1724 to the first attenuator can be employed for better isolation from the DUT/CUT 1522. The other input to the differential amplifier 1720 includes the output voltage of the DUT/CUT 1522 through a second buffer 1726 to a second attenuator 1728, and an output buffer 1730 thereof. An output of the differential amplifier 1720 is the cell voltage signal 1706 that is passed to the scope 1614 through an output delay 1721.

In the case of polymer cell testing, the trigger circuit can include a cell bias block 1732 for biasing the cell current and voltage. The cell current is input to an amplifier 1734, and to a buffer amplifier 1736 to generate the cell current signal 1708 through an output delay 1738 to the scope 1514. Note that an optional buffer 1740 can be employed between the amplifier 1734 and the buffer amplifier 1736 for further signal processing.

The output of the buffer amplifier 1736 is also passed as an input to a first comparator 1742 and as an input to a second comparator 1744. The first comparator 1742 functions to signal the transition from Erase to Program operations on the DUT/CUT. The second comparator 1744 functions to provide two outputs which are passed to first and second AND logic (1746 and 1748) to provide a transition signal back to the AWG 104 that should signal a transition from Program to Erase operations on the DUT/CUT. A third comparator 1750 receives the input Program/Erase waveform pattern from the AWG 104 and sends its output as an input to the first AND logic 1746.

The output delays (1718, 1721, and 1738) can be provided using predetermined lengths of coaxial cable, for example.

Figure 18:
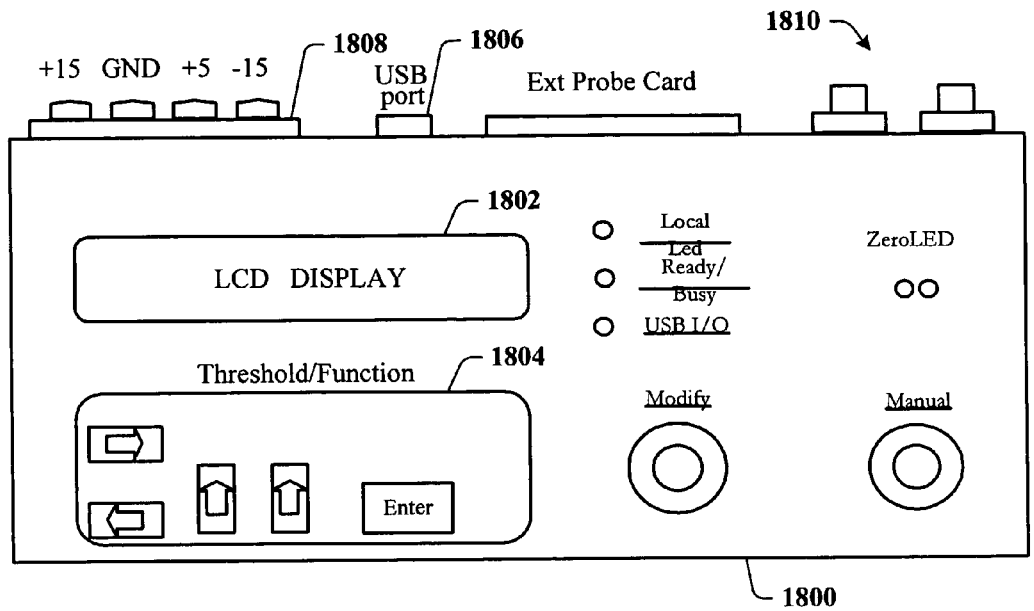
FIG. 18 illustrates one implementation of a mechanical layout for a tester chassis in accordance with the present invention.

Referring now to FIG. 18, there is illustrated one implementation of a mechanical layout for a tester front panel 1800 in accordance with the present invention. The panel 1800 includes a display 1802 for displaying data and settings according to user selections and controls. The display 1802 can be an LCD (Liquid Crystal Display), plasma, or other display device suitable for the desired presentation functions. A threshold/function input panel 1804 provides a number of buttons 1806 that facilitate selecting a variety of functions provided by the tester and displayed via the display 1802. The tester 1800 provides a menuing system that is presented using the display 1802, and the input control of which is facilitated by the input panel buttons.

The tester 1800 also includes a number of LEDs that provide status indications as to various operations. For example, a Local LED indicates to the user when the tester 1800 is being operated in local mode versus remote mode (from the PC). A Ready/Busy LED indicates when the tester has reached a ready state or is currently in a busy state. A USB (Universal Serial Bus) LED indicates when there is USB activity on a USB port 1806. A Zero LED indicates to the user when the output waveform has been zeroed. A set of modify knobs allow the user to make adjusts to the waveform parameters. A Manual set of knobs allows the user to make manual adjustments to tester functions.

The tester 1800 includes an output power bus 1808 for connecting power to the DUT/CUT, and adjusting the output voltages according to the particular DUT/CUT. A couple coaxial output connectors 1810 facilitate communicating high frequency data and signal to suitable equipment. The tester 1800 also includes an external probe card to facilitate making connection to the DUT/CUT and cell control block. Other components and/or ports can be added, such as an IEEE 1394 serial port, an external access port for inserting or removing a variety of flash memory cards as the shape memory, and/or sample buffer memory. Additionally, wireless communications boards and/or circuits can be employed to facilitate wireless communication with an external PC or other equipment.

Figure 19:
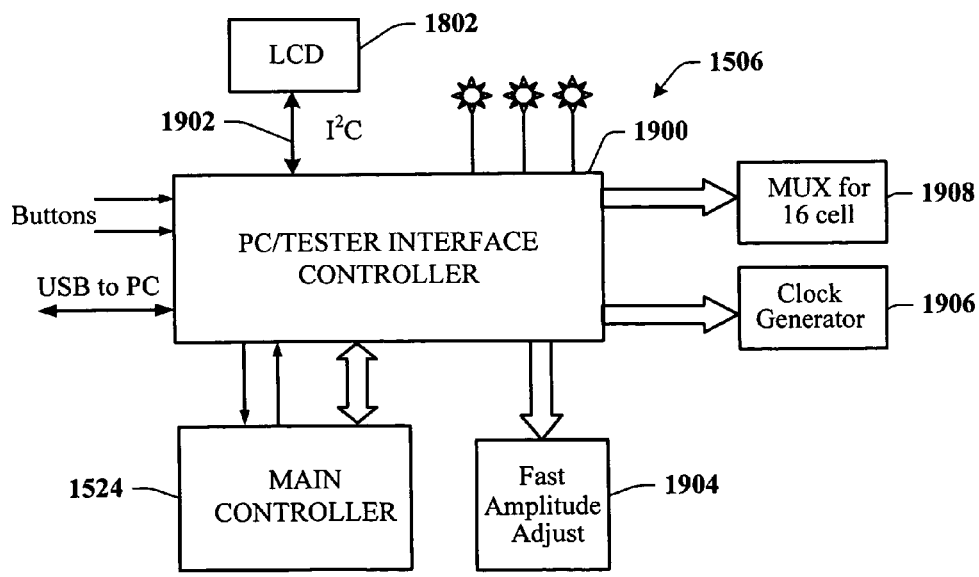
FIG. 19 illustrates a block diagram of the user interface processing components of the PC/Tester interface card of FIG. 15.

Referring now to FIG. 19, there is illustrated a block diagram of the user interface processing components of the PC/Tester interface card 1506 of FIG. 15. The card 1506 includes an interface controller 1900 that facilitates presenting data via the display 1802 over an I²C bus 1902, for example. The controller 1900 also facilitates USB connectivity between the tester and an external computer, and processing of tester button settings. The interface controller 1900 also communicates with the main controller 1524, a fast amplitude adjust block 1904, clock generator 1906 for sending the sequence of triggers for waveform selection, and a MUX 1908 for testing multiple cells, for example.

A graphical representation of the tester can be displayed on an external PC display and controlled therefrom. The representation includes all the knobs, dials, indicators, and readouts. As parameters are entered through the user interface, a microprocessor-based control unit performs the processing and conversions, and prepares the data path accordingly.

Figure 20:
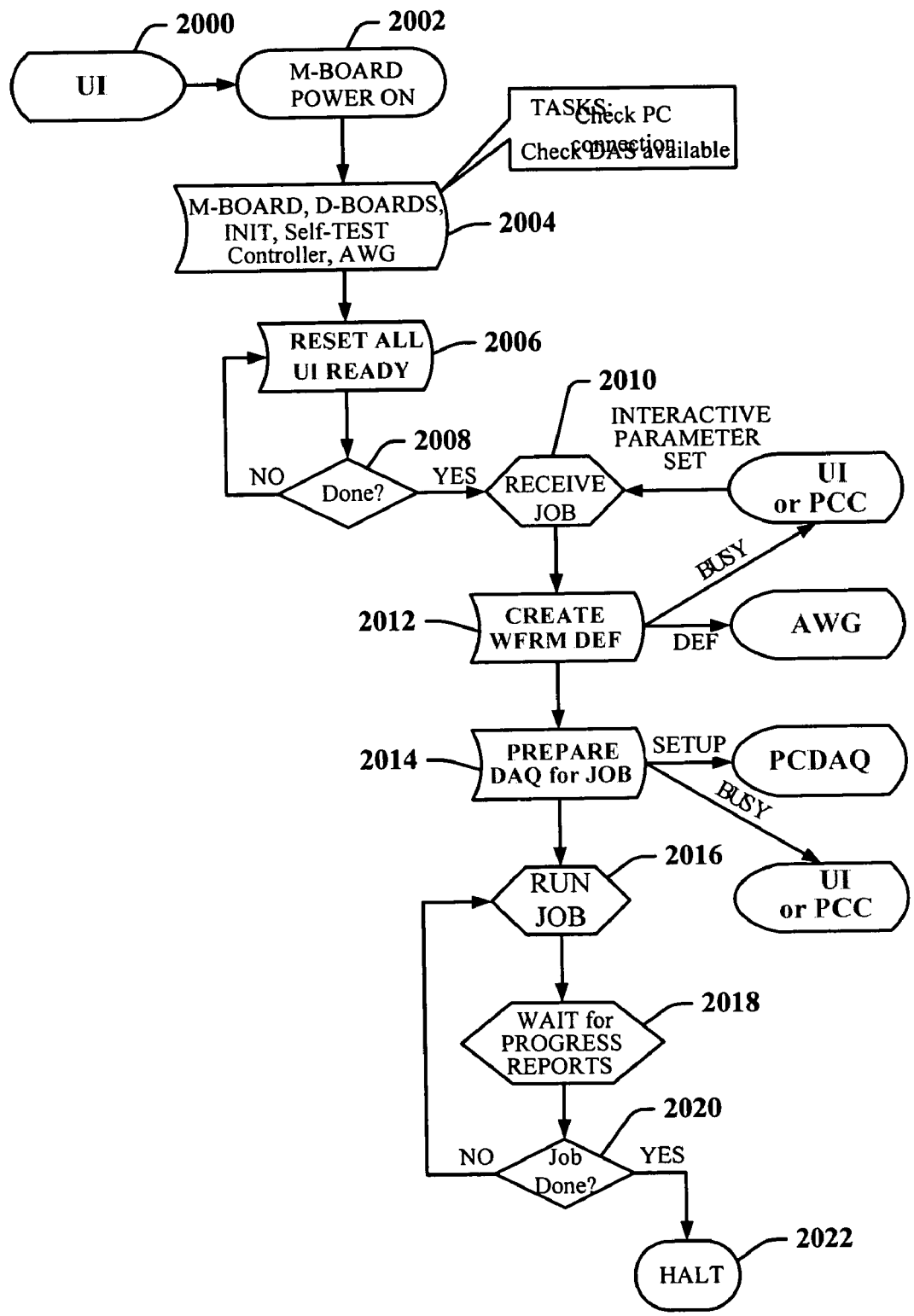
FIG. 20 illustrates a flow chart of a single job cycle.

Referring now to FIG. 20, there is illustrated a flow chart of a single job cycle. At 2000, the UI facilitates powering-up the AWG motherboard, as indicated at 2002. At 2004, the tester boards (both motherboard and daughter boards) power-up, initialize, perform a self-test, check the PC connection and check if the DAS is available. Once powered up, the UI is ready, and all components can be reset to ensure a common starting point in both software and hardware, as indicated at 2006. At 2008, the system determines if all system have recovered from the reset. If NO, flow is back to 2006 to perform another reset. If YES, flow is to 2010, to receive a job. The computer UI or PCC (PC Controller) can be used to facilitate this via interactive parameter settings.

At 2012, waveform definitions are created, and passed to the AWG. At 2014, the DAS is prepared for the job by sending parameters to the PC DAS subsystem. At 2016, the job is run. At 2018, the system waits for progress reports (or data) to be received. At 2020, the system checks to see if the job has completed. If NO, flow is back to 2016 to continue running the job. If YES, the system halts, as indicated at 2022.

Figure 21:
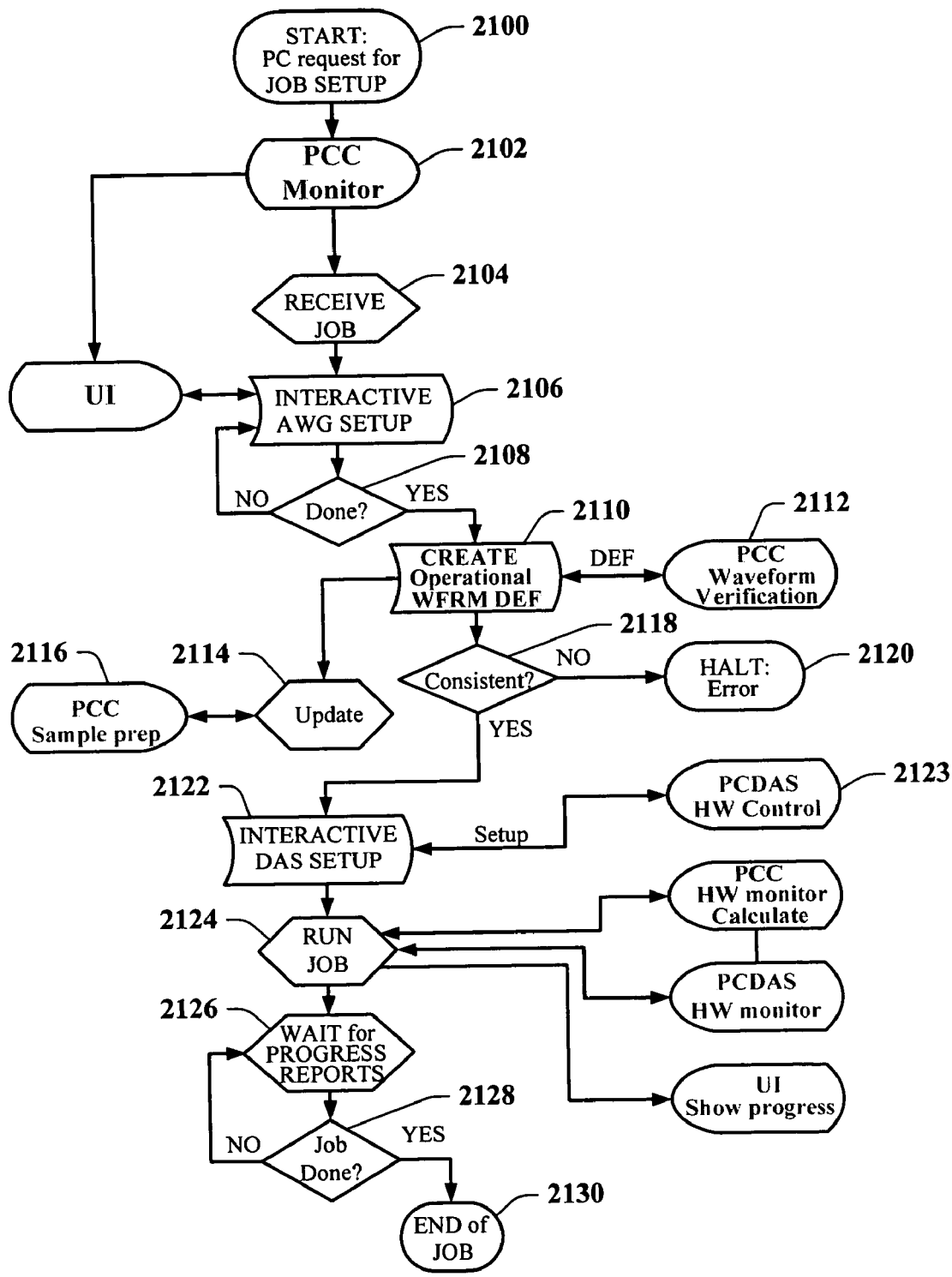
FIG. 21 illustrates a flow diagram for defining one implementation of a new AWG and DAS job via an external computer using the user interface.

Referring now to FIG. 21, there is illustrated a flow diagram for defining one implementation of a new AWG and DAS job via an external computer using the user interface. At 2100, the PC requests information of configuring the job. At 2102, the PCC monitors the system status of readiness of the PC interface and other system functions. Once the system is ready, flow proceeds to 2104, where the job information is received.

At 2106, the system provides an interactive AWG setup interface for configuring the job. Following are settings for one implementation of the present invention. User entries are guided by a program presented to the user via the UI. The user enters the sample rate $SR_{awg}$ (having a default value of 100 MHz at 7-bit resolution and a range of about 1M–100M). The WRR is entered (having a default values of 100 KHz, at 24-bit resolution and a range of about 10–10M). The Time Intervals is entered for the present job, at 20-bit resolution and a range of about 1–1 M, and for the short-term testing, the number of waveform cycles at 27-bit resolution and a range of about 1–128M.

Waveform parameters are entered relating to the following: number of slices (e.g., up to 16), the initial point (with last point of trigger and trigger voltage) and slope; trigger (Stop waveform, delay form trigger, Vg threshold, cell current (Program and Erase thresholds); and unconditional triggers information. At this time, the following calculations can be performed: Sample time=$1/SR_{awg}$; waveform cycle time=1/WRR; samples per waveform cycle=$SR_{awg}$/WRR; total samples per interval=($SR_{awg}$/WRR) *$N_{cycles}=T_{int}*SR_{awg}$; and total waveform cycles per interval=$N_{cycles}=T_{int}*$WRR.

In one version of the UI, a computer screen is provided with all the parameters displayed as little entry windows, each having the sub-menus as needed. At the end of the selection the user selects presses "OK", after which the initial calculations will generate an 'acknowledge' if parameters are consistent and the waveform can be generated. Otherwise, it should warn the user about inconsistencies.

Thus, at 2108, the system determines if the user has completed entry of setting information. If NO, flow is back to 2106 to continue entry of the settings. If YES, flow is to 2110 the system creates an operational waveform definition. At 2112, the definition is passed to the PCC for waveform verification, and to update the main controller and fast logic of the AWG, as indicated at 2114. At 2116, the PCC then receives the updated main controller and fast logic information, and prepares a sample job. At 2118, the system determines if the definition is consistent. If NO, an error is posted and the system halts, as indicated at 2120.

If YES, flow is to 2122 to provide interactive setup for the DAS. This is accommodated by hardware control from the PC, as indicated at 2123. Following are settings for one implementation of the present invention. The Sample Rate $SR_{acq}$ is entered (having a default of 100 MHz, with 7-bit resolution and range of about 1M–100M). The storage strategy for the present job is addressed, including All of the memory (MEMORY FULL at $SR_{acq}$), or selected portions (only a few samples/cycle), in which case the user can enter the samples around a fixed position, a Position number within a cycle, and number of samples, samples at each trigger point (the number of samples at that point). Calculation in the main controller (e.g., an FPGA) include the following: samples per waveform cycle=$SR_{acq}$/WRR (e.g., 10M max); total samples per interval=$SR_{acq}$/WRR) *$N_{cycle}=T_{int}*SR_{acq}$; total waveform cycles per interval=$N_{cycles}=T_{int}*$WRR; and qualifiers in every cycle. The settings are stored at the request of the user.

For long-term testing (endurance, retention) only a few samples per cycle are needed. Moreover, the records could be cycle qualifiers (e.g., go/no-go), and not actual samples. To allow for this, the qualifiers need to be determined each cycle inside the main controller (based on the digitized data), and then sent to the DAS board for storage.

When the interactive setup has completed, flow is to 2124 to run the job. This involves interaction with the PCC, PC DAS, and UI. At 2126, the system waits to receive progress reports. At 2128, the system uses the progress reports to determine if the job is done. If NO, flow is back to 2126 to continuing waiting. If YES, the job has completed, and an end of job block 2130 is reached.

Figure 22:
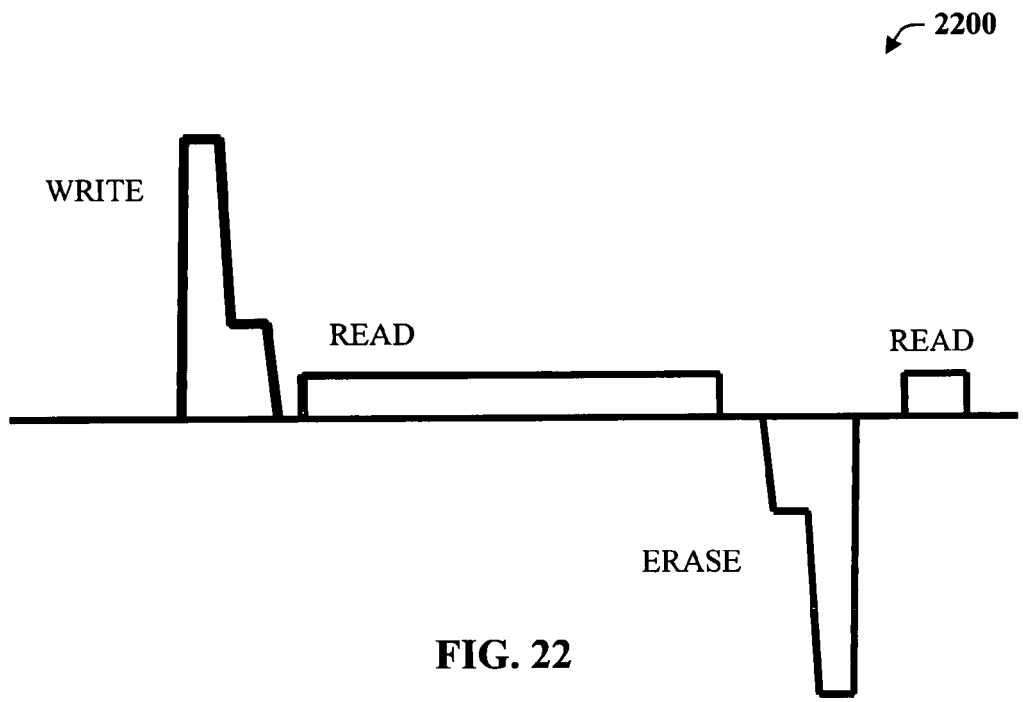
FIG. 22 illustrates a plot of a typical Write/Erase cycle in accordance with the present invention.

Referring now to FIG. 22, there is illustrated a plot 2200 of a typical Write/Erase cycle in accordance with the present invention. The plot 2200 shows that an initial write pulse is provided followed by a read pulse to test that the write was successful. An erase pulse is then imposed on the cell followed by another read pulse to ensure that the erase cycle was successful.

Figure 23:
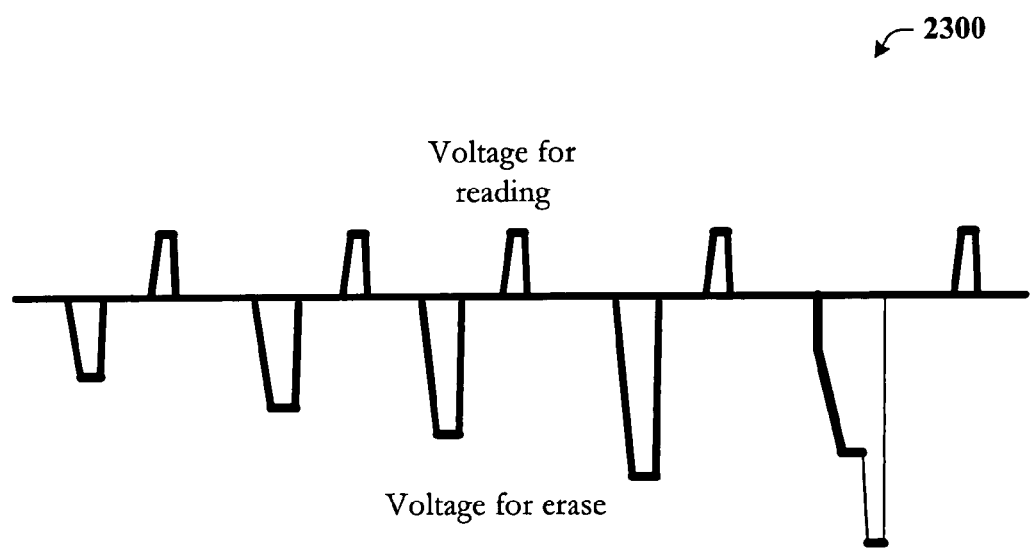
FIG. 23 illustrates a plot of an Erase/Read waveform in accordance with the present invention.

Referring now to FIG. 23, there is illustrated a plot 2300 of an Erase/Read waveform in accordance with the present invention. Positive voltage pulses are used for reading the cell, and negative voltage pulses are used for erasing the cell.

Referring now to FIG. 24, there is illustrated a plot 2400 of an incremental cycling waveform in accordance with the present invention. The waveform is comprised of a number of incremental pulses each having a predefined amplitude, from a minimum amplitude of $V_{start}$ and a maximum amplitude of $V_{end}$ for a positive set of pulses, and from an amplitude of $-V_{start}$ to an amplitude of $-V_{end}$ for a negative set of pulses. The pulse amplitudes can be defined to differ by an incremental voltage ($\Delta V$) such that remaining pulses are a factor of the first pulse of the set. After each pulse has been applied, there is a period in which the system measures the cell resistance. Furthermore, after the set of increasingly positive pulse voltages have been applied, the negative set of decreasingly negative voltages is applied (a polarity reversal).

Figure 25:
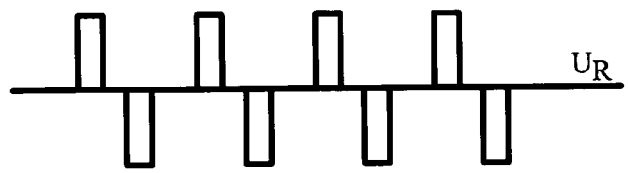
FIG. 25 illustrates a plot of a double-pulse read waveform in accordance with the present invention.

Referring now to FIG. 25, there is illustrated a plot 2500 of a double-pulse read waveform in accordance with the present invention for the purpose of retention testing.

Figure 26:
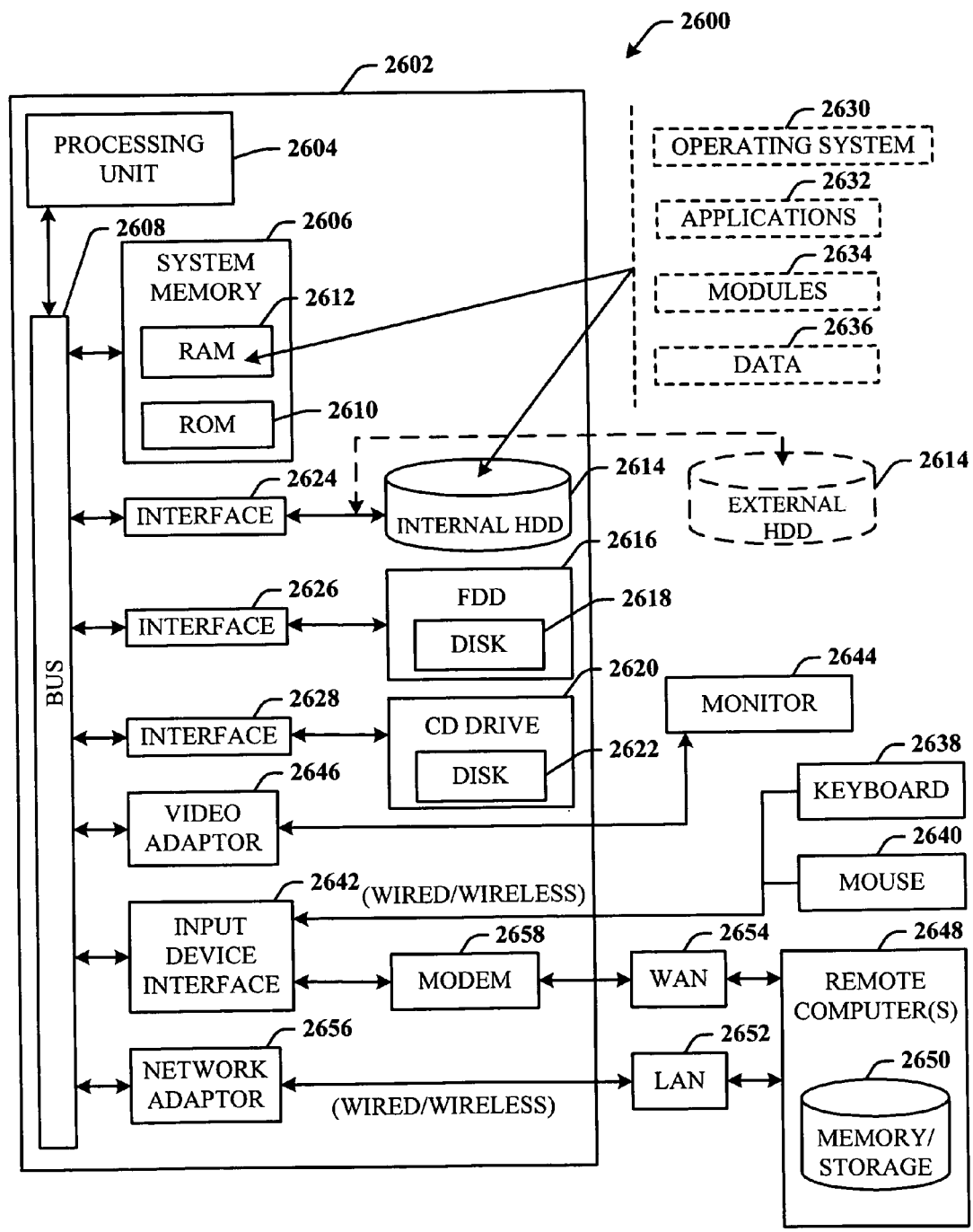
FIG. 26 illustrates a block diagram of a computer operable to execute the disclosed architecture.

Referring now to FIG. 26, there is illustrated a block diagram of a computer operable to execute the disclosed architecture. In order to provide additional context for various aspects of the present invention, FIG. 26 and the following discussion are intended to provide a brief, general description of a suitable computing environment 2600 in which the various aspects of the present invention may be implemented. While the invention has been described above in the general context of computer-executable instructions that may run on one or more computers, those skilled in the art will recognize that the invention also may be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods may be practiced with other computer system configurations, including single-processor or multiprocessor computer systems, minicomputers, mainframe computers, as well as personal computers, hand-held computing devices, microprocessor-based or programmable consumer electronics, and the like, each of which may be operatively coupled to one or more associated devices.

The illustrated aspects of the invention may also be practiced in distributed computing environments where certain tasks are performed by remote processing devices that are linked through a communications network. In a distributed computing environment, program modules may be located in both local and remote memory storage devices.

A computer typically includes a variety of computer-readable media. Computer-readable media can be any available media that can be accessed by the computer and includes both volatile and nonvolatile media, removable and non-removable media. By way of example, and not limitation, computer readable media can comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital video disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

With reference again to FIG. 26, there is illustrated an exemplary environment 2600 for implementing various aspects of the invention that includes a computer 2602, the computer 2602 including a processing unit 2604, a system memory 2606 and a system bus 2608. The system bus 2608 couples system components including, but not limited to, the system memory 2606 to the processing unit 2604. The processing unit 2604 may be any of various commercially available processors. Dual microprocessors and other multi-processor architectures may also be employed as the processing unit 2604.

The system bus 2608 can be any of several types of bus structure that may further interconnect to a memory bus (with or without a memory controller), a peripheral bus, and a local bus using any of a variety of commercially available bus architectures. The system memory 2606 includes read only memory (ROM) 2610 and random access memory (RAM) 2612. A basic input/output system (BIOS) is stored in a non-volatile memory 2610 such as ROM, EPROM, EEPROM, which BIOS contains the basic routines that help to transfer information between elements within the computer 2602, such as during start-up. The RAM 2612 can also include a high-speed RAM such as static RAM for caching data.

The computer 2602 further includes an internal hard disk drive (HDD) 2614 (e.g., EIDE, SATA), which internal hard disk drive 2614 may also be configured for external use in a suitable chassis (not shown), a magnetic floppy disk drive (FDD) 2616, (e.g., to read from or write to a removable diskette 2618) and an optical disk drive 2620, (e.g., reading a CD-ROM disk 2622 or, to read from or write to other high capacity optical media such as the DVD). The hard disk drive 2614, magnetic disk drive 2616 and optical disk drive 2620 can be connected to the system bus 2608 by a hard disk drive interface 2624, a magnetic disk drive interface 2626 and an optical drive interface 2628, respectively. The interface 2624 for external drive implementations includes at least one or both of Universal Serial Bus (USB) and IEEE 1394 interface technologies.

The drives and their associated computer-readable media provide nonvolatile storage of data, data structures, computer-executable instructions, and so forth. For the computer 2602, the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer, such as zip drives, magnetic cassettes, flash memory cards, cartridges, and the like, may also be used in the exemplary operating environment, and further, that any such media may contain computer-executable instructions for performing the methods of the present invention.

A number of program modules can be stored in the drives and RAM 2612, including an operating system 2630, one or more application programs 2632, other program modules 2634 and program data 2636. All or portions of the operating system, applications, modules, and/or data can also be cached in the RAM 2612.

It is appreciated that the present invention can be implemented with various commercially available operating systems or combinations of operating systems.

A user can enter commands and information into the computer 2602 through one or more wired/wireless input devices, e.g., a keyboard 2638 and a pointing device, such as a mouse 2640. Other input devices (not shown) may include a microphone, an IR remote control, a joystick, a game pad, a stylus pen, touch screen, or the like. These and other input devices are often connected to the processing unit 2604 through an input device interface 2642 that is coupled to the system bus 2608, but may be connected by other interfaces, such as a parallel port, an IEEE 1394 serial port, a game port, a USB port, an IR interface, etc.

A monitor 2644 or other type of display device is also connected to the system bus 2608 via an interface, such as a video adapter 2646. In addition to the monitor 2644, a computer typically includes other peripheral output devices (not shown), such as speakers, printers etc.

The computer 2602 may operate in a networked environment using logical connections via wired and/or wireless communications to one or more remote computers, such as a remote computer(s) 2648. The remote computer(s) 2648 may be a workstation, a server computer, a router, a personal computer, portable computer, microprocessor-based entertainment appliance, a peer device or other common network node, and typically includes many or all of the elements described relative to the computer 2602, although, for purposes of brevity, only a memory storage device 2650 is illustrated. The logical connections depicted include wired/wireless connectivity to a local area network (LAN) 2652 and/or larger networks, e.g., a wide area network (WAN) 2654. Such LAN and WAN networking environments are commonplace in offices, and companies, and facilitate enterprise-wide computer networks, such as intranets, all of which may connect to a global communication network, e.g., the Internet.

When used in a LAN networking environment, the computer 2602 is connected to the local network 2652 through a wired and/or wireless communication network interface or adapter 2656. The adaptor 2656 may facilitate wired or wireless communication to the LAN 2652, which may also include a wireless access point disposed thereon for communicating with the wireless adaptor 2656. When used in a WAN networking environment, the computer 2602 can include a modem 2658, or is connected to a communications server on the LAN, or has other means for establishing communications over the WAN 2654, such as by way of the Internet. The modem 2658, which may be internal or external and a wired or wireless device, is connected to the system bus 2608 via the serial port interface 2642. In a networked environment, program modules depicted relative to the computer 2602, or portions thereof, may be stored in the remote memory/storage device 2650. It will be appreciated that the network connections shown are exemplary and other means of establishing a communications link between the computers may be used.

The computer 2602 is operable to communicate with any wireless devices or entities operably disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This includes at least Wi-Fi and Bluetooth™ wireless technologies. Thus, the communication may be a predefined structure as with conventional network or simply an ad hoc communication between at least two devices.

Wi-Fi, or Wireless Fidelity, allows connection to the Internet from a couch at home, a bed in a hotel room or a conference room at work, without wires. Wi-Fi is a wireless technology like a cell phone that enables such devices, e.g., computers, to send and receive data indoors and out; anywhere within the range of a base station. Wi-Fi networks use radio technologies called IEEE 802.11(a, b, g, etc.) to provide secure, reliable, fast wireless connectivity. A Wi-Fi network can be used to connect computers to each other, to the Internet, and to wired networks (which use IEEE 802.3 or Ethernet). Wi-Fi networks operate in the unlicensed 2.4 and 5 GHz radio bands, with an 11 Mbps (802.11b) or 54 Mbps (802.11a) data rate or with products that contain both bands (dual band), so the networks can provide real-world performance similar to the basic 10BaseT wired Ethernet networks used in many offices.

What has been described above includes examples of the present invention. It is, of course, not possible to describe every conceivable combination of components or methodologies for purposes of describing the present invention, but one of ordinary skill in the art may recognize that many further combinations and permutations of the present invention are possible. Accordingly, the present invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system that facilitates testing a device, comprising:
a signal component that generates an output signal for application to the device;
a monitor component that monitors one or more parameters of the device while the device is being tested, and communicates with the signal component such that the output signal applied to the device during the test is automatically changed; wherein the output signal is pre-defined in advance of the test, such that a sequence of waveform slices are selectable so as to constitute the output signal and events that trigger switching from one slice of the sequence to another slice of the sequence during the test.

2. The system of claim 1, the device is one of a semiconductor device, a circuit board, an integrated circuit, and a portable computing device.

3. The system of claim 1, the signal component generates the output signal by assembling the output signal with one or more signal slices.

4. The system of claim 1, the signal component alters the output signal by changing characteristics of the output signal according to at least one of frequency, amplitude, and composition based on signal slices.

5. The system of claim 1, the signal component is an arbitrary waveform generator and the monitor component is a data acquisition system.

6. The system of claim 1, the output signal is changed in response to the one or more parameters measured by the monitor component.

7. The system of claim 1, wherein initial parameters of the output signal are defined, and thereafter, the output signal is adjusted automatically by the system according to changes in the one or more parameters of the device.

8. The system of claim 1, the output signal is generated from at least one of a positive ramp signal, a negative ramp signal, and a DC signal.

9. The system of claim 1, further comprising a memory that stores standard waveforms that are used to generate the output signal.

10. A system that facilitates characterizing electrical behavior of a cell, comprising:
a arbitrary waveform generator component that generates an output waveform for application to the cell;
a data acquisition component that monitors at least one of voltage across the cell and current through the cell to determine a change in one or more electrical parameters of the cell while the cell is being tested, a monitor component communicates with a signal component such that the signal component changes the output waveform in response to a change in the electrical behavior of the cell; and
the output signal is specified prior to the test, by selecting a series of waveform slices that form the output signal and events that trigger changing from one slice of the series to another slice of the series while conducting the test.

11. The system of claim 10, the voltage and current are digitized for further processing and display.

12. A computer that employs the system of claim 10.

13. The system of claim 10, wherein initial parameters of the output waveform are defined according to stored waveforms that include at least one of a positive ramp signal, a negative ramp signal, and a DC signal, such that the chosen series of waveform slices of the stored waveforms constitute the output waveform.

14. The system of claim 13, defines events that trigger switching from one slice of the sequence to another slice of the sequence are further defined during the test, and thereafter, the output waveform is adjusted automatically by the system according to changes in the one or more parameters of the cell.

15. A system that facilitates testing a device, comprising:
a housing;
a waveform generator component located in the housing that generates an output signal for application to the device;
a data acquisition component located in the housing that monitors one or more parameters of the device while the device is being tested, and communicates with the waveform generator component such that the waveform generator component changes the output signal being applied to the device during the test;
a trigger component located in the housing that communicates with the data acquisition component to detect a change in a state of the device during the test;
a user interface that allows interaction with a user for configuration and presentation of test information; and
the output signal is specified ahead of the test, by selecting a series of slices that will make up the output signal and events that trigger switching from one slice of the series to another slice of the series during the test.

16. The system of claim 15, the user interface is part of an external computer that communicates with components of the housing for the configuration and the presentation of the test information.

17. The system of claim 15, further comprising a display as part of the housing for presenting test information.

18. The system of claim 15, further comprising an oscilloscope in the housing that facilitates the processing and presentation of the one or more parameters of the device based on trigger events detected by the trigger component.

19. The system of claim 15, the user interface is included in the housing.

20. A method of testing a device, comprising:
defining an output signal in advance of the test;
providing a set of base waveforms in a memory;
defining initial settings of a test waveform to be applied to the device;
slicing the set of base waveforms into waveform slices;
assembling selected waveform slices in a sequence to form the test waveform;
choosing events that trigger switching from one slice of a sequence to another slice of a sequence during test;
applying the test waveform to the device during a test phase; and
changing the test waveform in response to a measured change in the device.

21. The method of claim 20, the act of changing further comprises at least one of the acts of,
changing an order of the slices;
adding a slice;
removing a slice;
altering a frequency of the waveform; and
altering a magnitude of the waveform.

22. The method of claim 20, further comprising defining threshold-based triggers according to a magnitude of a voltage and a current.

23. The method of claim 20, further comprising calculating a value for a waveform slice on-the-fly during the test when the value is previously unknown.

24. The method of claim 20, the set of base waveforms includes a baseline waveform that facilitates a baseline slice that serves as a reference for the test waveform.

25. The method of claim 20, the test waveform is a mixed signal.

26. The method of claim 20, one of the waveform slices is a combination of two or more of the base waveforms.

27. The system of claim 20, the set of base waveforms includes a baseline waveform that facilitates a baseline slice that serves as a reference for the test waveform.

28. A system that facilitates testing a cell, comprising:
means for defining an output signal in advance of the test;
means for providing a set of base waveforms in a memory;
means for slicing the set of base waveforms into waveform slices;
means for determining a sequence of the waveform slices that constitute a test waveform;
means for selecting one or more events that trigger switching from one slice to a next slice;
means for assembling selects ones of the waveform slices to form the test waveform;
means for applying the test waveform to the cell during a test phase; and
means for changing the test waveform in response to a measured change in the cell during the test phase.

29. The system of claim 28, further comprising means for defining threshold-based triggers according to magnitude of a voltage and a current.

30. The system of claim 28, further comprising means for calculating a value for a waveform slice on-the-fly during the test when the value is previously unknown.

* * * * *